US012651902B2

(12) United States Patent
Das et al.

(10) Patent No.: US 12,651,902 B2
(45) Date of Patent: Jun. 9, 2026

(54) SYSTEM AND METHOD FOR MAINTAINING A MEASURE OF ACCUMULATED ENERGY DELIVERED TO AN APPLIANCE BY A FIRST SMART SOCKET FOLLOWED BY A SECOND REPLACEMENT SMART SOCKET

(71) Applicant: HONEYWELL INTERNATIONAL INC., Charlotte, NC (US)

(72) Inventors: Shyam Kumar Mohan Das, Charlotte, NC (US); Neil Philip Brown, Charlotte, NC (US); Philip Anthony Barnett, Charlotte, NC (US); Rajiv R. Singh, Charlotte, NC (US); Priyanka Vivek Joshi, Charlotte, NC (US); Venkatram D, Charlotte, NC (US); Vinoth Durairaj, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 189 days.

(21) Appl. No.: 18/493,873

(22) Filed: Oct. 25, 2023

(65) Prior Publication Data

US 2024/0142502 A1 May 2, 2024

(30) Foreign Application Priority Data

Oct. 28, 2022 (IN) .............................. 202211061491

(51) Int. Cl.
*G01R 21/00* (2006.01)
*G01R 21/06* (2006.01)
(Continued)

(52) U.S. Cl.
CPC ............ *H02J 3/007* (2020.01); *G01R 21/007* (2013.01); *H02J 3/001* (2020.01); *H02J 3/14* (2013.01)

(58) Field of Classification Search
CPC .... G01R 21/06; G01R 21/007; G01R 22/061; G01R 22/068; H02J 3/001; H02J 3/007
See application file for complete search history.

(56) References Cited

U.S. PATENT DOCUMENTS

2002/0120369 A1* 8/2002 Boies ..................... G06Q 50/06
700/290
2010/0145542 A1* 6/2010 Chapel ..................... H02J 3/14
700/295

(Continued)

FOREIGN PATENT DOCUMENTS

| CN | 107168087 A | 9/2017 | |
| CN | 105527850 B | 9/2019 | |
| WO | WO-2013179671 A1 * | 12/2013 | ........ H02J 13/00034 |

OTHER PUBLICATIONS

Patents Act 1977: Search Report under Section 17, Application No. GB2316189.6, GB Intellectual Property Office, Apr. 2, 2024 (4 pages).

*Primary Examiner* — Douglas X Rodriguez
*Assistant Examiner* — Kendrick X Liu
(74) *Attorney, Agent, or Firm* — Seager, Tufte & Wickhem, LLP

(57) ABSTRACT

A method for maintaining a measure of accumulated energy delivered to an appliance includes a supervisor repeatedly receiving from a first smart socket a measure of energy delivered to the appliance by the first smart socket and maintaining a measure of accumulated energy delivered to the appliance. When the first smart socket fails and is replaced, the method includes repeatedly receiving from the second smart socket a measure of energy delivered to the appliance by the second smart socket, maintaining the measure of accumulated energy delivered to the appliance based at least in part on the measures previously received from the first smart socket and the measures repeatedly (Continued)

received from the second smart socket of energy delivered
to the appliance by the second smart socket, and displaying
the measure of accumulated energy delivered to the appli-
ance on a dashboard.

18 Claims, 21 Drawing Sheets

(51) Int. Cl.

| | | |
|---|---|---|
| *G01R 22/06* | (2006.01) | |
| *H02J 3/001* | (2026.01) | |
| *H02J 3/007* | (2026.01) | |
| *H02J 3/14* | (2006.01) | |

(56) References Cited

U.S. PATENT DOCUMENTS

| | | | |
|---|---|---|---|
| 2012/0223840 A1* | 9/2012 | Guymon ................ | H04B 3/54 |
| | | | 340/870.02 |
| 2013/0178996 A1 | 7/2013 | Li et al. | |
| 2016/0266183 A1 | 9/2016 | Park | |
| 2020/0366079 A1* | 11/2020 | Telefus ............. | H02J 13/00022 |
| 2021/0018334 A1 | 1/2021 | Liu et al. | |

* cited by examiner

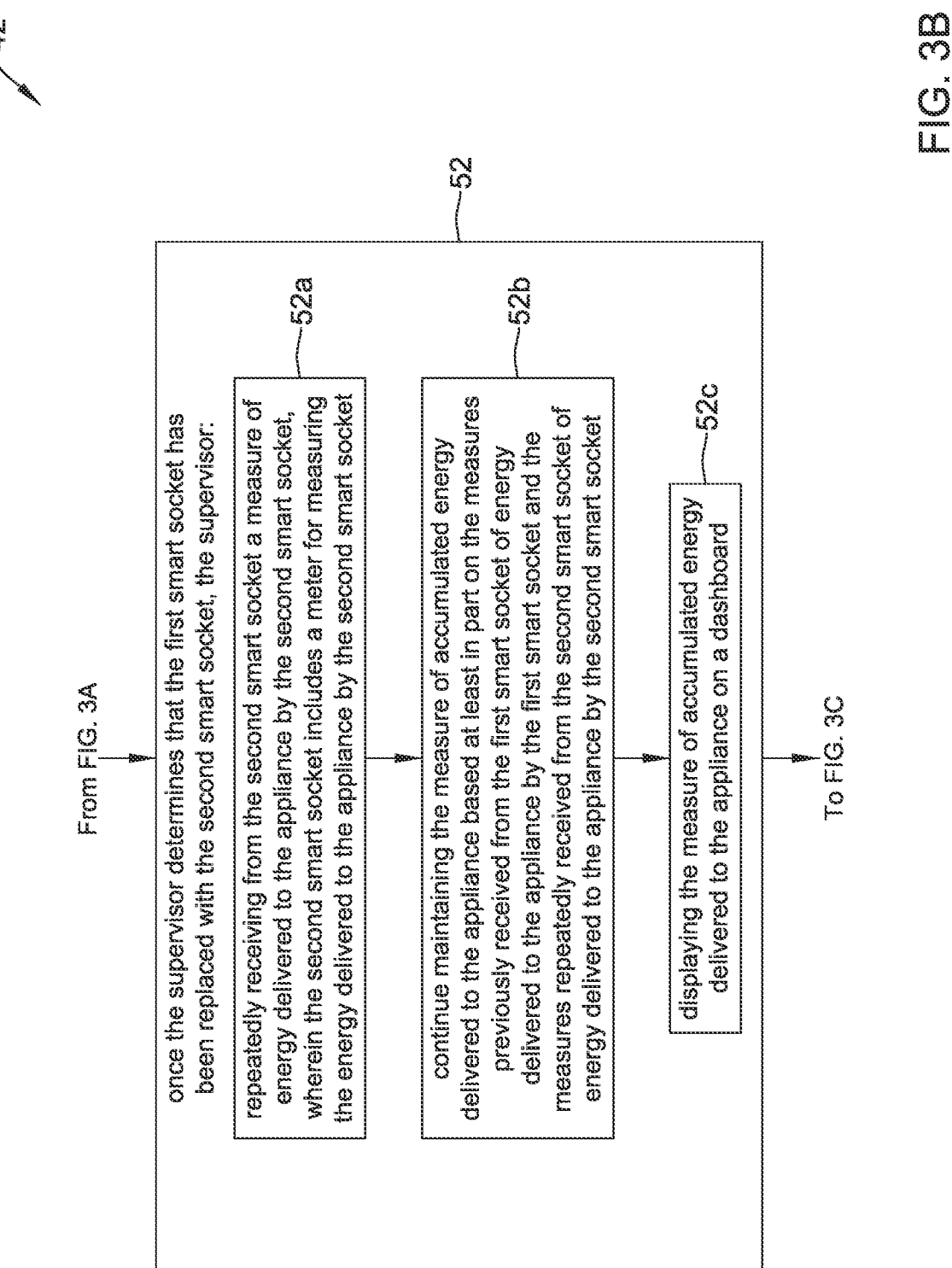

42

From FIG. 3A

52 once the supervisor determines that the first smart socket has been replaced with the second smart socket, the supervisor:

52a repeatedly receiving from the second smart socket a measure of energy delivered to the appliance by the second smart socket, wherein the second smart socket includes a meter for measuring the energy delivered to the appliance by the second smart socket 52b continue maintaining the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket 52c displaying the measure of accumulated energy delivered to the appliance on a dashboard To FIG. 3C

FIG. 3B

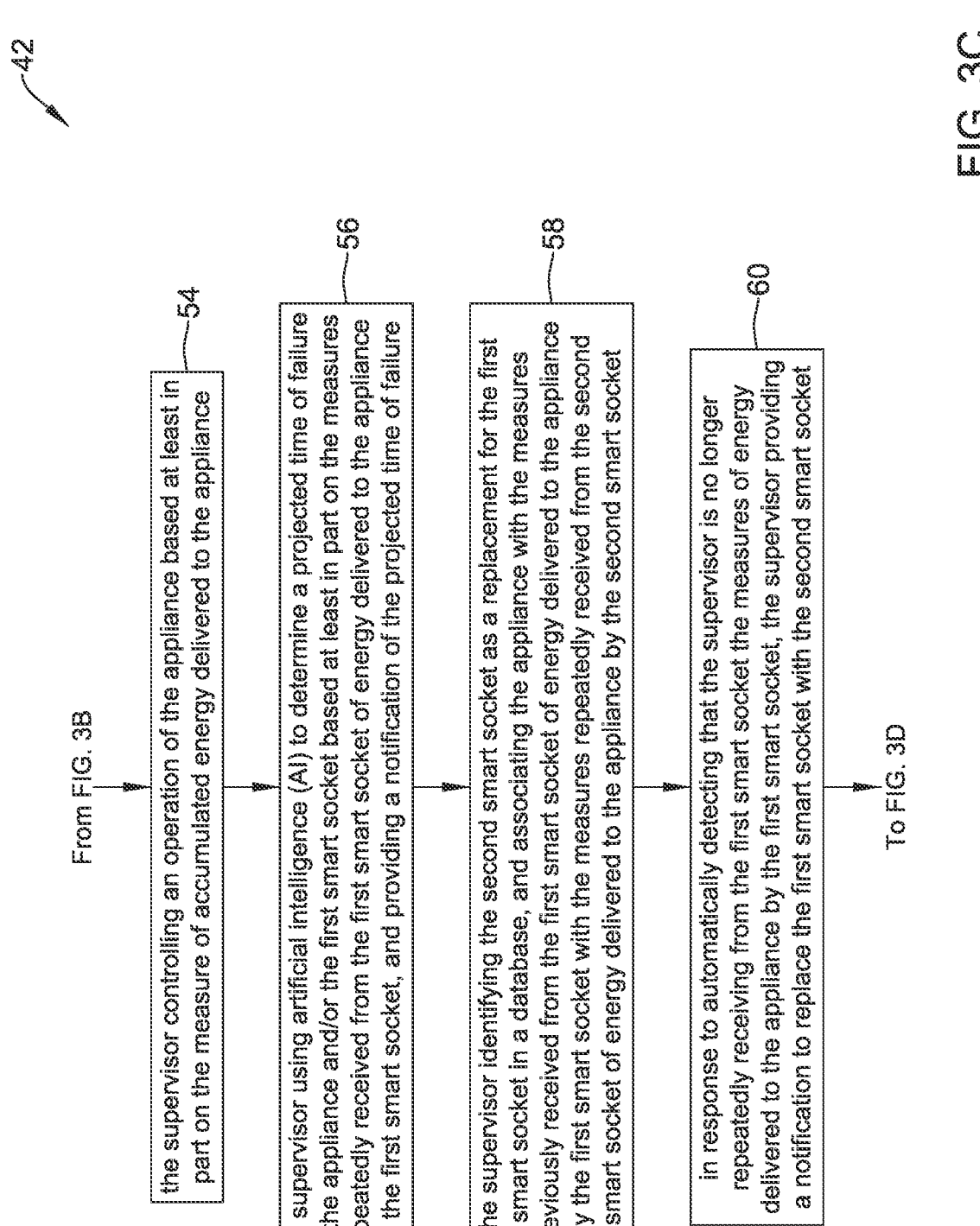

From FIG. 3B

42

54 — the supervisor controlling an operation of the appliance based at least in part on the measure of accumulated energy delivered to the appliance 56 — the supervisor using artificial intelligence (AI) to determine a projected time of failure of the appliance and/or the first smart socket based at least in part on the measures repeatedly received from the first smart socket of energy delivered to the appliance by the first smart socket, and providing a notification of the projected time of failure 58 — the supervisor identifying the second smart socket as a replacement for the first smart socket in a database, and associating the appliance with the measures previously received from the first smart socket of energy delivered to the appliance by the first smart socket with the measures repeatedly received from the second smart socket of energy delivered to the appliance by the second smart socket 60 — in response to automatically detecting that the supervisor is no longer repeatedly receiving from the first smart socket the measures of energy delivered to the appliance by the first smart socket, the supervisor providing a notification to replace the first smart socket with the second smart socket To FIG. 3D

FIG. 3C

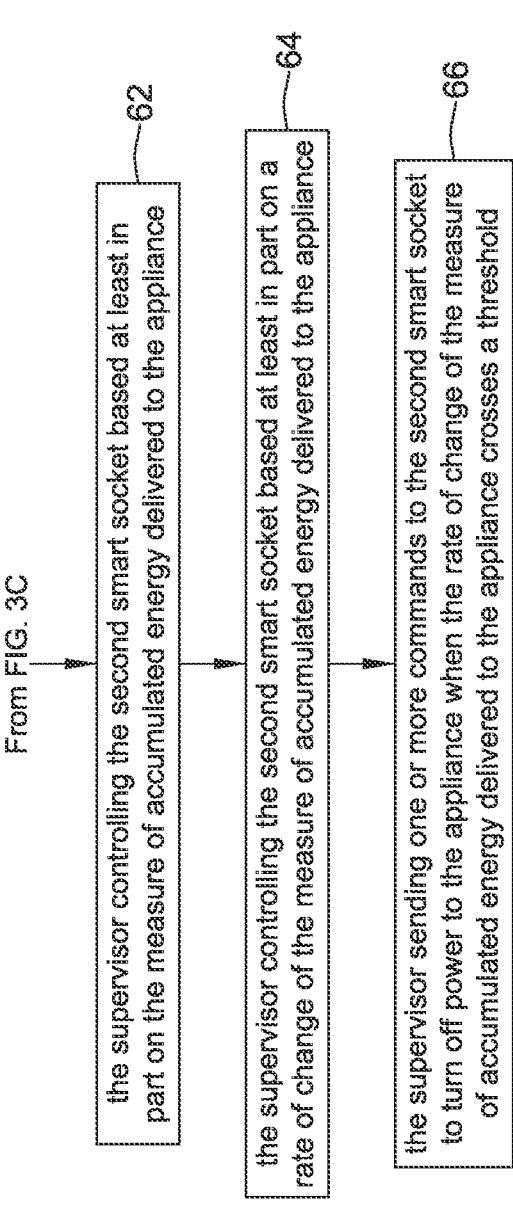

From FIG. 3C the supervisor controlling the second smart socket based at least in part on the measure of accumulated energy delivered to the appliance — 62 the supervisor controlling the second smart socket based at least in part on a rate of change of the measure of accumulated energy delivered to the appliance — 64 the supervisor sending one or more commands to the second smart socket to turn off power to the appliance when the rate of change of the measure of accumulated energy delivered to the appliance crosses a threshold — 66

FIG. 3D

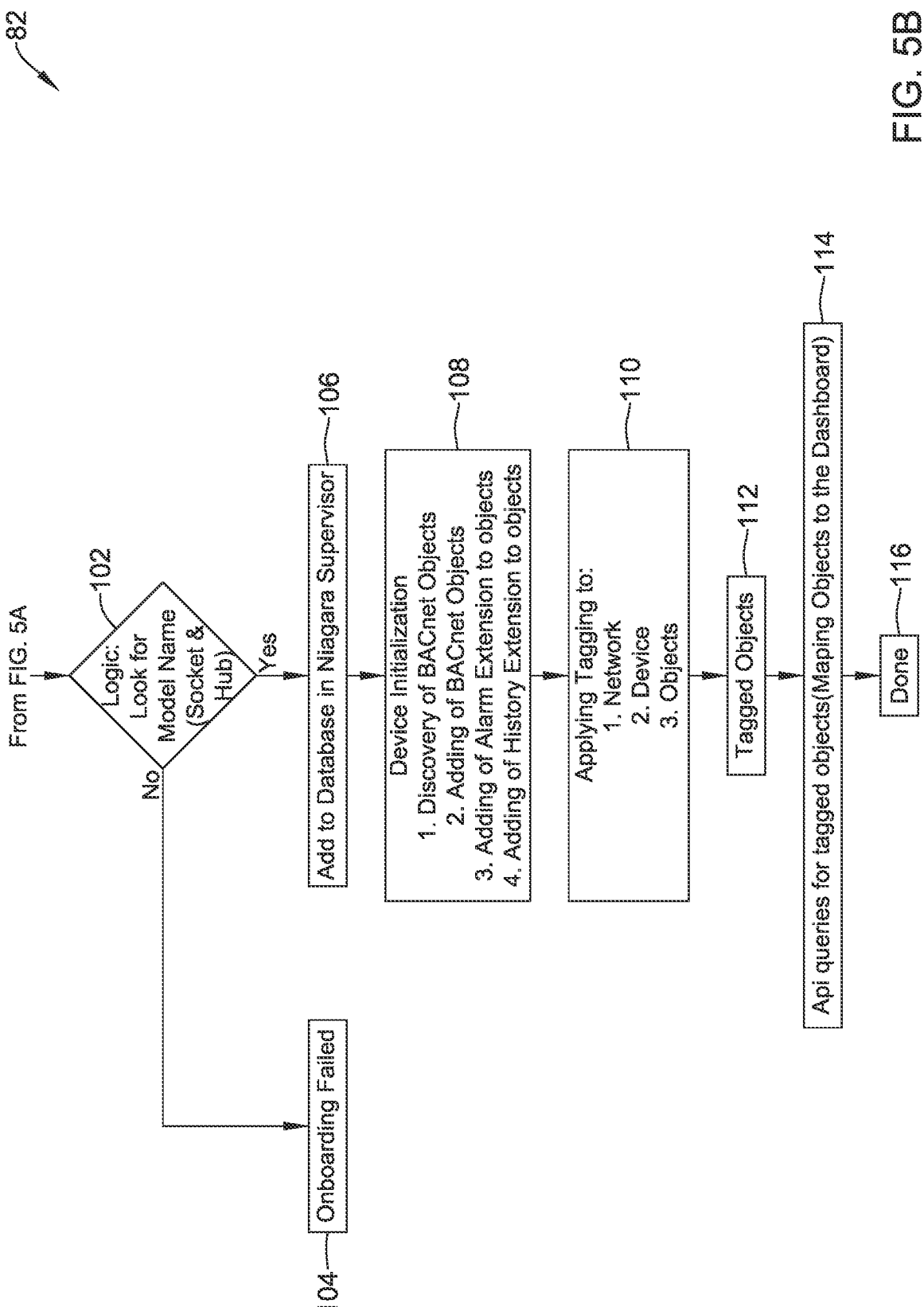

82

From FIG. 5A

102

Logic:
Look for
Model Name
(Socket &
Hub)

No

Yes

104 — Onboarding Failed

106 — Add to Database in Niagara Supervisor

108

Device Initialization
1. Discovery of BACnet Objects
2. Adding of BACnet Objects
3. Adding of Alarm Extension to objects
4. Adding of History Extension to objects

110

Applying Tagging to:
1. Network
2. Device
3. Objects

112 — Tagged Objects

114

Api queries for tagged objects(Maping Objects to the Dashboard)

116 — Done

FIG. 5B

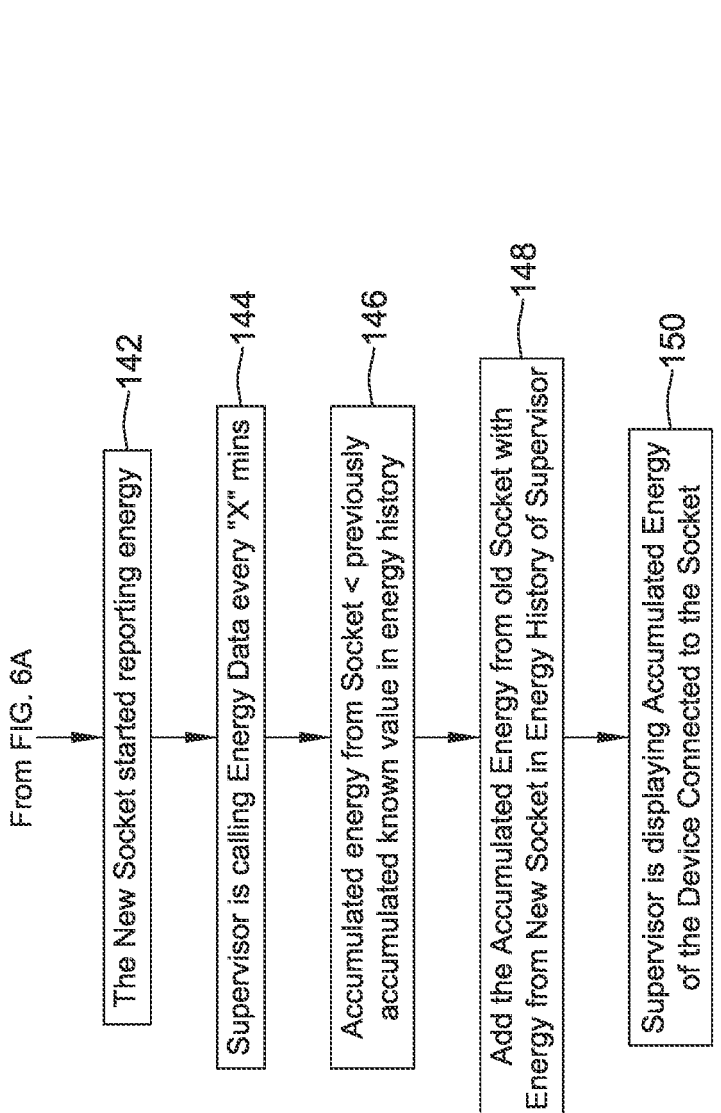

From FIG. 6A

The New Socket started reporting energy — 142

Supervisor is calling Energy Data every "X" mins — 144

Accumulated energy from Socket < previously accumulated known value in energy history — 146

Add the Accumulated Energy from old Socket with Energy from New Socket in Energy History of Supervisor — 148

Supervisor is displaying Accumulated Energy of the Device Connected to the Socket — 150

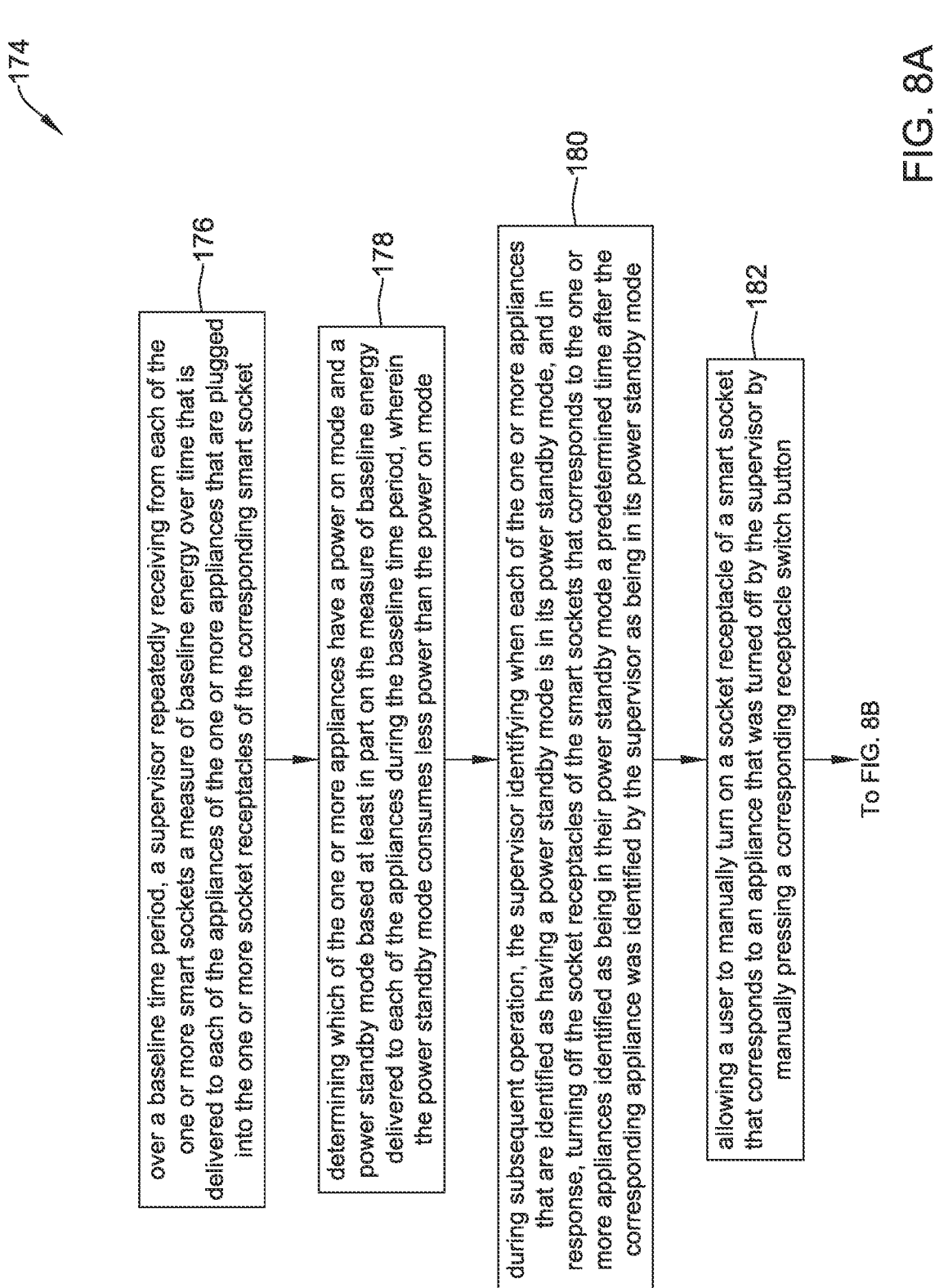

174

176 — over a baseline time period, a supervisor repeatedly receiving from each of the one or more smart sockets a measure of baseline energy over time that is delivered to each of the appliances of the one or more appliances that are plugged into the one or more socket receptacles of the corresponding smart socket 178 — determining which of the one or more appliances have a power on mode and a power standby mode based at least in part on the measure of baseline energy delivered to each of the appliances during the baseline time period, wherein the power standby mode consumes less power than the power on mode 180 — during subsequent operation, the supervisor identifying when each of the one or more appliances that are identified as having a power standby mode is in its power standby mode, and in response, turning off the socket receptacles of the smart sockets that corresponds to the one or more appliances identified as being in their power standby mode a predetermined time after the corresponding appliance was identified by the supervisor as being in its power standby mode 182 — allowing a user to manually turn on a socket receptacle of a smart socket that corresponds to an appliance that was turned off by the supervisor by manually pressing a corresponding receptacle switch button

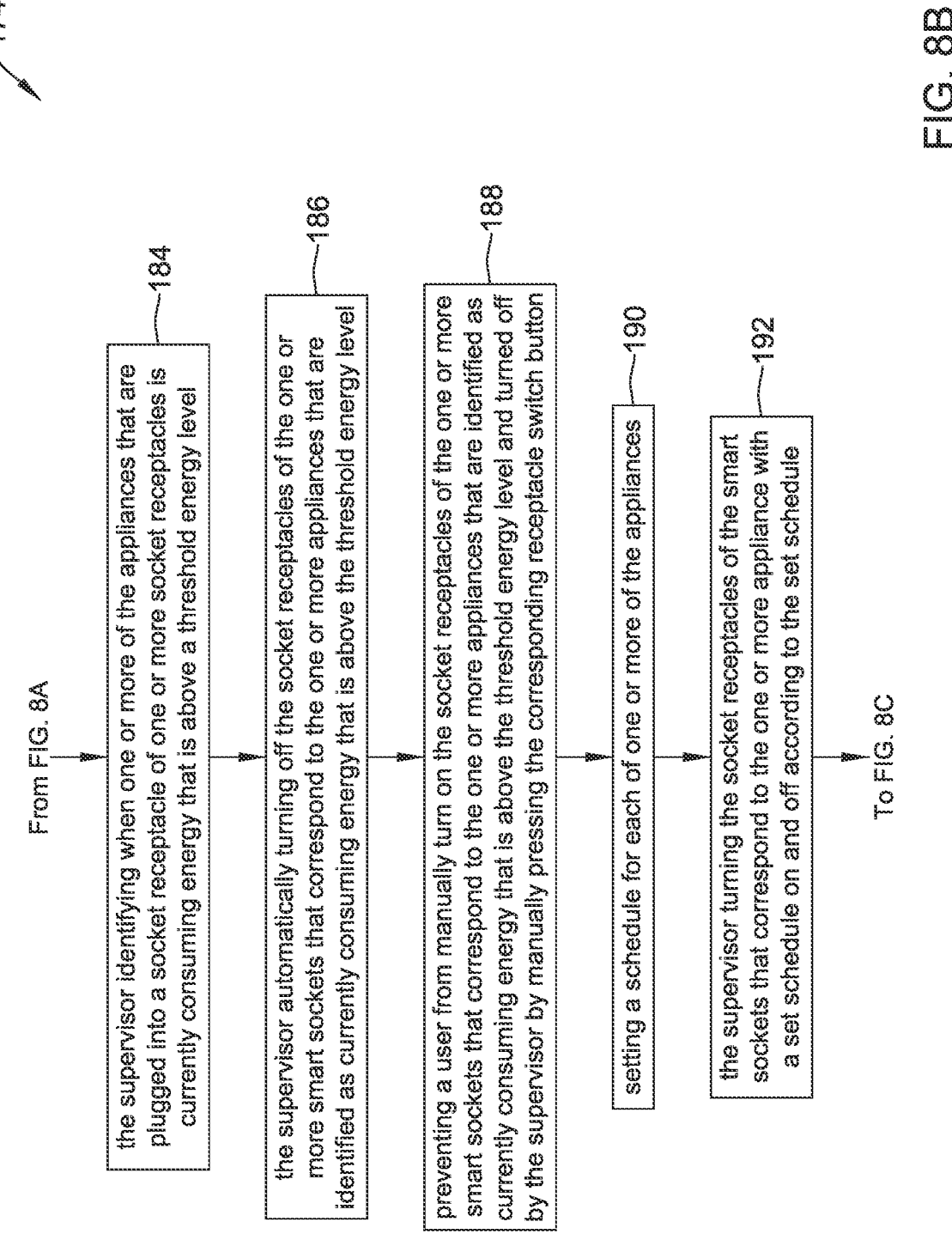

From FIG. 8A the supervisor identifying when one or more of the appliances that are plugged into a socket receptacle of one or more socket receptacles is currently consuming energy that is above a threshold energy level ⌐184 the supervisor automatically turning off the socket receptacles of the one or more smart sockets that correspond to the one or more appliances that are identified as currently consuming energy that is above the threshold energy level ⌐186 preventing a user from manually turn on the socket receptacles of the one or more smart sockets that correspond to the one or more appliances that are identified as currently consuming energy that is above the threshold energy level and turned off by the supervisor by manually pressing the corresponding receptacle switch button ⌐188 setting a schedule for each of one or more of the appliances ⌐190 the supervisor turning the socket receptacles of the smart sockets that correspond to the one or more appliance with a set schedule on and off according to the set schedule ⌐192

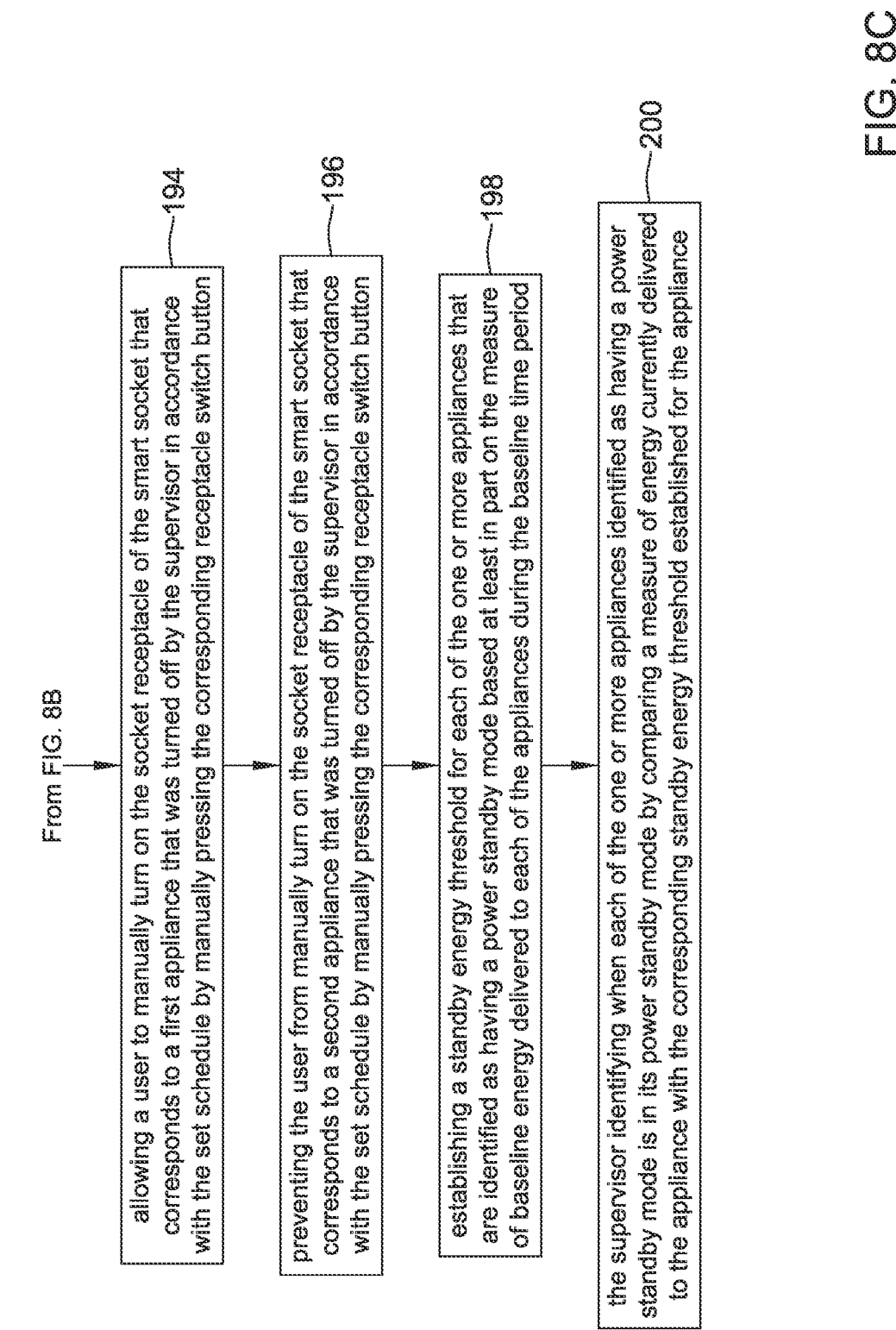

From FIG. 8B

174 allowing a user to manually turn on the socket receptacle of the smart socket that corresponds to a first appliance that was turned off by the supervisor in accordance with the set schedule by manually pressing the corresponding receptacle switch button

194 preventing the user from manually turn on the socket receptacle of the smart socket that corresponds to a second appliance that was turned off by the supervisor in accordance with the set schedule by manually pressing the corresponding receptacle switch button

196 establishing a standby energy threshold for each of the one or more appliances that are identified as having a power standby mode based at least in part on the measure of baseline energy delivered to each of the appliances during the baseline time period

198 the supervisor identifying when each of the one or more appliances identified as having a power standby mode is in its power standby mode by comparing a measure of energy currently delivered to the appliance with the corresponding standby energy threshold established for the appliance

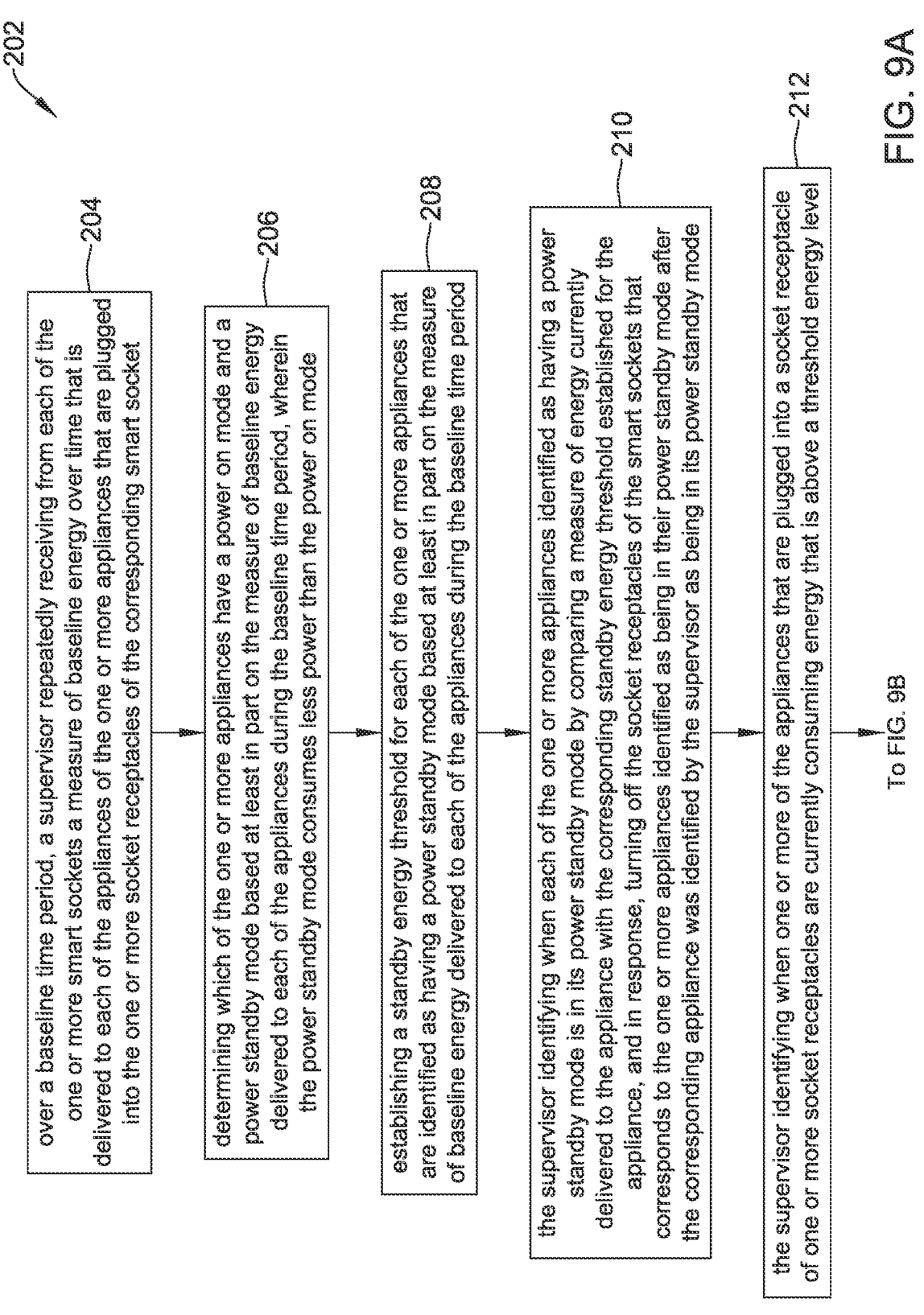

202 over a baseline time period, a supervisor repeatedly receiving from each of the one or more smart sockets a measure of baseline energy over time that is delivered to each of the appliances of the one or more appliances that are plugged into the one or more socket receptacles of the corresponding smart socket

204 determining which of the one or more appliances have a power on mode and a power standby mode based at least in part on the measure of baseline energy delivered to each of the appliances during the baseline time period, wherein the power standby mode consumes less power than the power on mode

206 establishing a standby energy threshold for each of the one or more appliances that are identified as having a power standby mode based at least in part on the measure of baseline energy delivered to each of the appliances during the baseline time period

208 the supervisor identifying when each of the one or more appliances identified as having a power standby mode is in its power standby mode by comparing a measure of energy currently delivered to the appliance with the corresponding standby energy threshold established for the appliance, and in response, turning off the socket receptacles of the smart sockets that corresponds to the one or more appliances identified as being in their power standby mode after the corresponding appliance was identified by the supervisor as being in its power standby mode

210 the supervisor identifying when one or more of the appliances that are plugged into a socket receptacle of one or more socket receptacles are currently consuming energy that is above a threshold energy level

From FIG. 9A the supervisor automatically turning off the socket receptacles of the one or more smart sockets that correspond to the one or more appliances that are identified as currently consuming energy that is above the threshold energy level —214 setting a schedule for each of one or more of the appliances —216 the supervisor turning the socket receptacles of the smart sockets that correspond to the one or more appliance with a set schedule on and off according to the set schedule —218 allowing a user to manually turn on the socket receptacle of the smart socket that corresponds to an appliance that was turned off by the supervisor in accordance with the set schedule by manually pressing the corresponding receptacle switch button —220 preventing a user from manually turn on the socket receptacle of the smart socket that corresponds to an appliance that was turned off by the supervisor in accordance with the set schedule by manually pressing the corresponding receptacle switch button —222

202

FIG. 9B

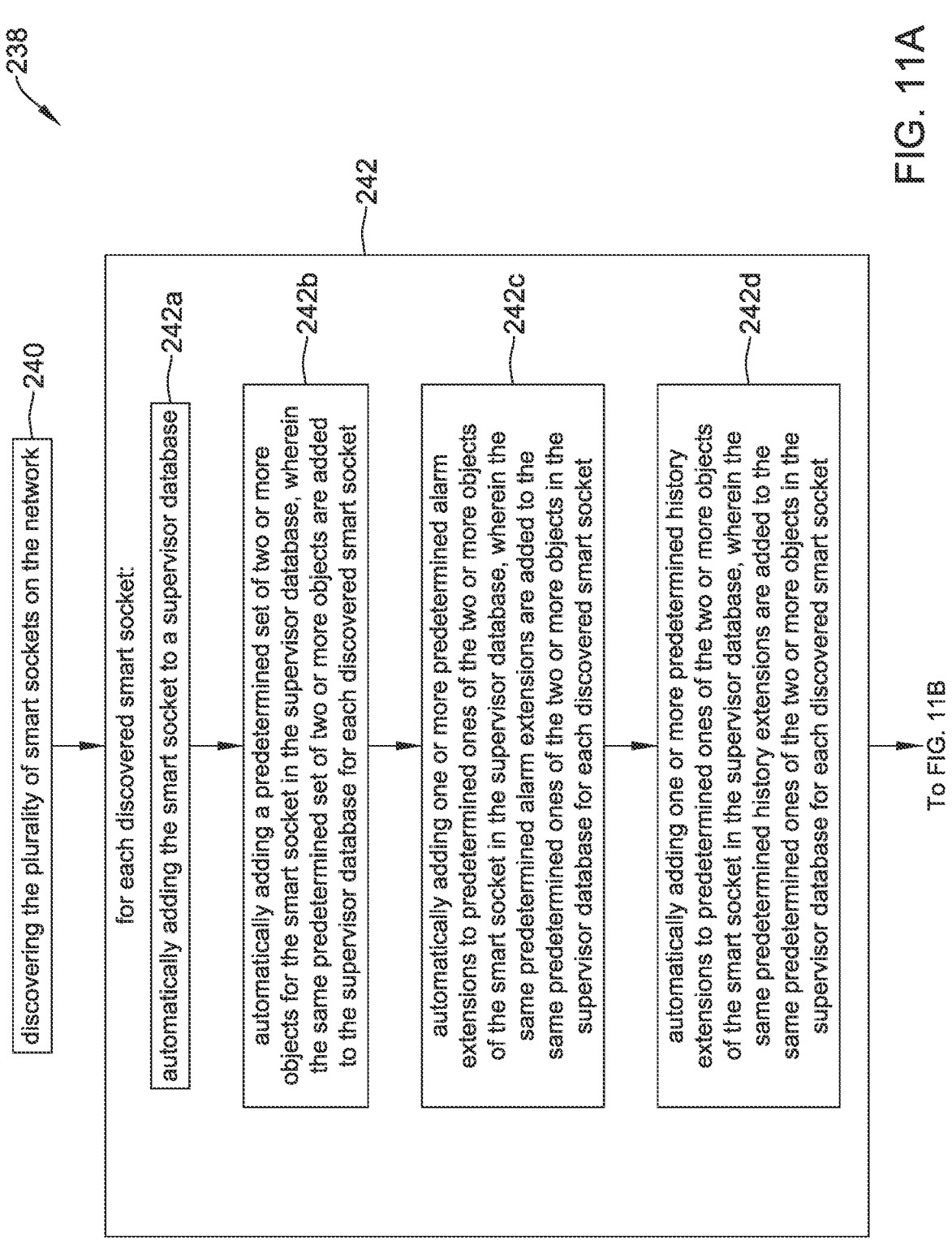

238

240 — discovering the plurality of smart sockets on the network

242

242a — for each discovered smart socket:
automatically adding the smart socket to a supervisor database 242b — automatically adding a predetermined set of two or more objects for the smart socket in the supervisor database, wherein the same predetermined set of two or more objects are added to the supervisor database for each discovered smart socket 242c — automatically adding one or more predetermined alarm extensions to predetermined ones of the two or more objects of the smart socket in the supervisor database, wherein the same predetermined alarm extensions are added to the same predetermined ones of the two or more objects in the supervisor database for each discovered smart socket 242d — automatically adding one or more predetermined history extensions to predetermined ones of the two or more objects of the smart socket in the supervisor database, wherein the same predetermined history extensions are added to the same predetermined ones of the two or more objects in the supervisor database for each discovered smart socket To FIG. 11B

FIG. 11A

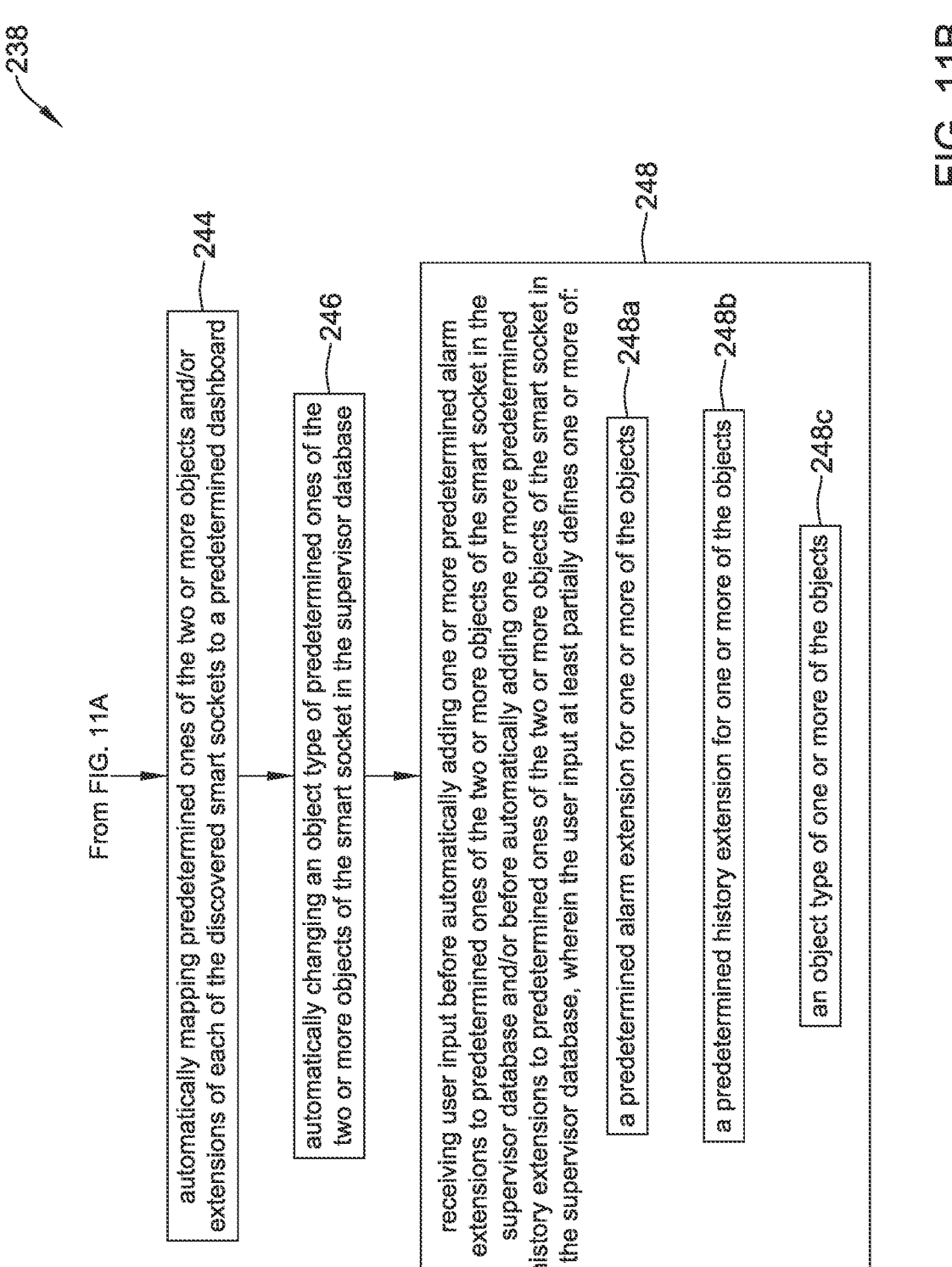

238

From FIG. 11A automatically mapping predetermined ones of the two or more objects and/or extensions of each of the discovered smart sockets to a predetermined dashboard
244 automatically changing an object type of predetermined ones of the two or more objects of the smart socket in the supervisor database
246 receiving user input before automatically adding one or more predetermined alarm extensions to predetermined ones of the two or more objects of the smart socket in the supervisor database and/or before automatically adding one or more predetermined history extensions to predetermined ones of the two or more objects of the smart socket in the supervisor database, wherein the user input at least partially defines one or more of:
248 a predetermined alarm extension for one or more of the objects
248a a predetermined history extension for one or more of the objects
248b an object type of one or more of the objects
248c

FIG. 11B

SYSTEM AND METHOD FOR MAINTAINING A MEASURE OF ACCUMULATED ENERGY DELIVERED TO AN APPLIANCE BY A FIRST SMART SOCKET FOLLOWED BY A SECOND REPLACEMENT SMART SOCKET

CROSS-REFERENCE TO RELATED APPLICATIONS

This application claims priority pursuant to 35 U.S.C. 119(a) to Indian Application No. 202211061491, filed Oct. 28, 2022, which application is incorporated herein by reference in its entirety.

TECHNICAL FIELD

The present disclosure relates generally to smart sockets, and more particularly to monitoring energy consumption of an appliance using a smart socket system.

BACKGROUND

Smart sockets provide power to a variety of different devices that are plugged into a smart socket. Smart sockets can include circuitry that allows a user to remotely control the smart socket to control whether the smart socket provides power to a device that is connected to a receptacle of the smart socket. A number of smart sockets may communicate with a central controller, reporting power consumption values and other parameters to the central controller. When a smart socket fails, and needs to be replaced, the replacement smart socket does not have the historical energy consumption data that was previously measured by the original smart socket. This can result in less accurate energy consumption data. It would be desirable to maintain a measure of accumulated energy consumption by an appliance when replacing a failed smart socket.

SUMMARY

The present disclosure relates generally to smart sockets, and more particularly to monitoring energy consumption of an appliance using a smart socket system. An example may be found in a method for maintaining a measure of accumulated energy delivered to an appliance. The illustrative method includes a supervisor repeatedly receiving from a first smart socket a measure of energy delivered to the appliance by the first smart socket, wherein the first smart socket includes a meter for measuring the energy delivered to the appliance by the first smart socket. The supervisor maintains a measure of accumulated energy delivered to the appliance based at least in part on the measures repeatedly received from the first smart socket of energy delivered to the appliance by the first smart socket. The method includes automatically detecting when the supervisor is no longer repeatedly receiving from the first smart socket the measures of energy delivered to the appliance by the first smart socket, indicating that the first smart socket has experienced a fault and should be replaced with a second smart socket. The supervisor determines that the first smart socket has been replaced with the second smart socket. Upon making this determination, the supervisor carries out several steps. The steps include repeatedly receiving from the second smart socket a measure of energy delivered to the appliance by the second smart socket, wherein the second smart socket includes a meter for measuring the energy delivered to the appliance by the second smart socket. The steps include continue maintaining the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket. The steps include displaying the measure of accumulated energy delivered to the appliance on a dashboard.

Another example may be found in a system for maintaining a measure of accumulated energy delivered to an appliance. The system includes a first smart socket that includes a meter for measuring the energy delivered to the appliance by the first smart socket and a second smart socket that includes a meter for measuring the energy delivered to the appliance by the second smart socket, the second smart socket for replacing the first smart socket. The system includes a supervisor. The supervisor is configured to repeatedly receive from the first smart socket a measure of energy delivered to the appliance by the first smart socket and to maintain a measure of accumulated energy delivered to the appliance based at least in part on the measures repeatedly received from the first smart socket of energy delivered to the appliance by the first smart socket. The supervisor is configured to automatically detect when the supervisor is no longer repeatedly receiving from the first smart socket measures of energy delivered to the appliance by the first smart socket, indicating that the first smart socket has experienced a fault and should be replaced with the second smart socket. The supervisor is configured to determine that the first smart socket has been replaced with the second smart socket, repeatedly receive from the second smart socket a measure of energy delivered to the appliance by the second smart socket, and continue to maintain the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket.

Another example may be found in a non-transitory, computer-readable storage medium having executable instructions stored thereon. When the executable instructions are executed by one or more processors, the one or more processors are caused to repeatedly receive from a first smart socket a measure of energy delivered to an appliance by the first smart socket, wherein the first smart socket includes a meter for measuring the energy delivered to the appliance by the first smart socket, and to maintain a measure of accumulated energy delivered to the appliance based at least in part on the measures repeatedly received from the first smart socket of energy delivered to the appliance by the first smart socket. The one or more processors are caused to determine that the first smart socket has been replaced with a second smart socket, repeatedly receive from the second smart socket a measure of energy delivered to the appliance by the second smart socket, and continue to maintain the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket.

The preceding summary is provided to facilitate an understanding of some of the innovative features unique to the present disclosure and is not intended to be a full description. A full appreciation of the disclosure can be gained by taking the entire specification, claims, figures, and abstract as a whole.

BRIEF DESCRIPTION OF THE FIGURES

The disclosure may be more completely understood in consideration of the following description of various examples in connection with the accompanying drawings, in which:

FIGS. 3A, 3B, 3C and 3D are flow diagrams that together show an illustrative method for maintaining a measure of accumulated energy delivered to an appliance;

FIGS. 5A and 5B are flow diagrams that together show an illustrative method;

FIGS. 6A and 6B are flow diagrams that together show an illustrative method;

FIGS. 8A, 8B and 8C are flow diagrams that together show an illustrative method for reducing energy consumption of one or more appliances;

FIGS. 9A and 9B are flow diagrams that together show an illustrative method for reducing energy consumption of one or more appliances;

FIGS. 11A and 11B are flow diagrams that together show an illustrative method for on-boarding a plurality of smart sockets with a supervisor.

Figure 1:
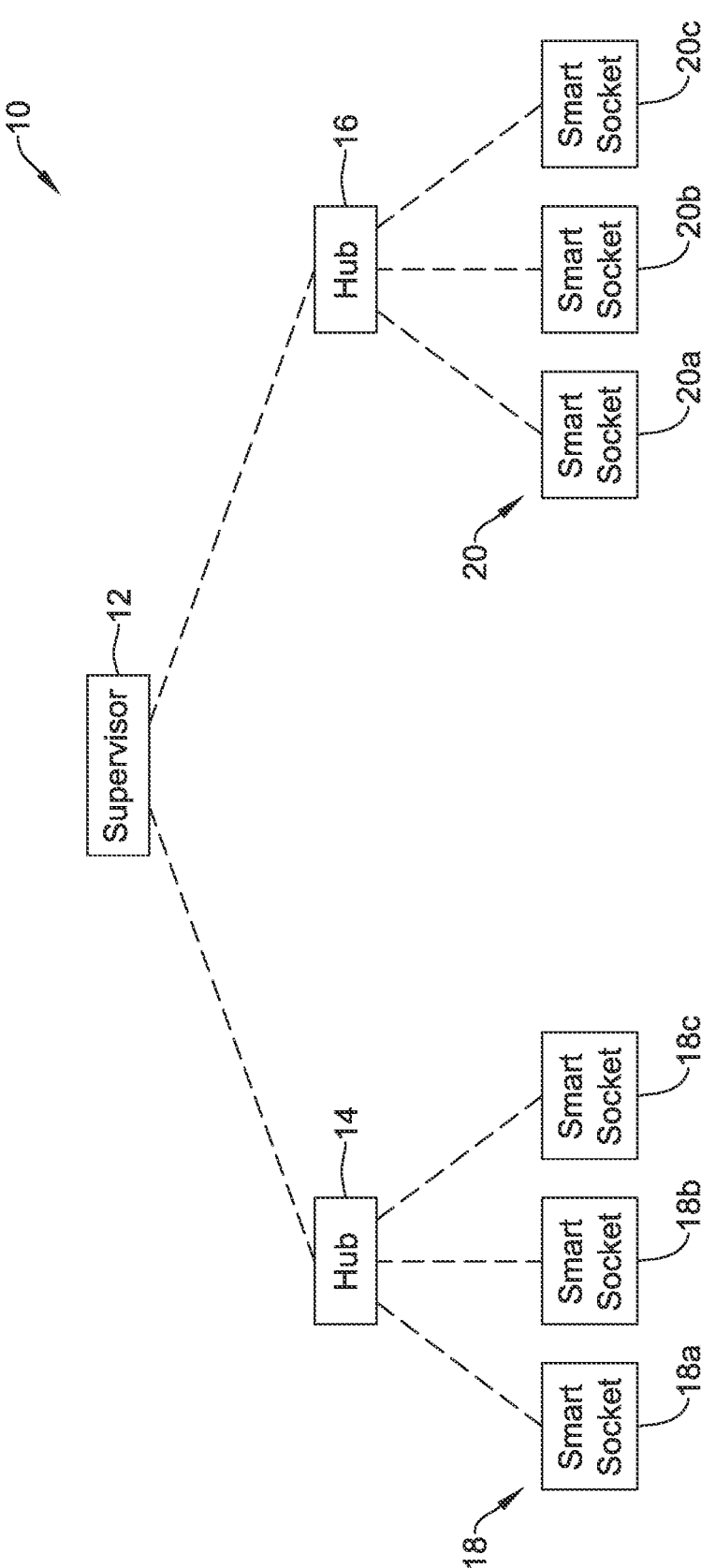
FIG. 1 is a schematic block diagram showing an illustrative system.

While the disclosure is amenable to various modifications and alternative forms, specifics thereof have been shown by way of example in the drawings and will be described in detail. It should be understood, however, that the intention is not to limit the disclosure to the particular examples described. On the contrary, the intention is to cover all modifications, equivalents, and alternatives falling within the spirit and scope of the disclosure.

DESCRIPTION

The following description should be read with reference to the drawings, in which like elements in different drawings are numbered in like fashion. The drawings, which are not necessarily to scale, depict examples that are not intended to limit the scope of the disclosure. Although examples are illustrated for the various elements, those skilled in the art will recognize that many of the examples provided have suitable alternatives that may be utilized.

All numbers are herein assumed to be modified by the term "about", unless the content clearly dictates otherwise. The recitation of numerical ranged by endpoints includes all numbers subsumed within that range (e.g., 1 to 5 includes, 1, 1.5, 2, 2.75, 3, 3.8, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram showing an illustrative system 10. The illustrative system 10 includes a supervisor 12, a first gateway hub 14 and a second gateway hub 16. While two gateway hubs 14 and 16 are shown, it will be appreciated that this is merely illustrative, as the system 10 may include any number of gateway hubs. The system 10 includes a number of smart sockets, divided into a first group of smart sockets 18 and a second group of smart sockets 20. The smart sockets within the first group of smart sockets 18 are individually labeled as 18a, 18b and 18c. The smart sockets within the second group of smart sockets 20 are individually labeled as 20a, 20b and 20c. This is merely illustrative, as the first group of smart sockets 18 and/or the second group of smart sockets 20 may each include any number of smart sockets, and in some cases may include a substantially larger number of smart sockets.

In some instances, the first group of smart sockets 18 and the first gateway hub 14 may together be considered as forming a first wireless mesh network and the second group of smart sockets 20 and the second gateway hub 16 may together be considered as forming a second wireless mesh network. The devices within the first wireless mesh network communicate in normal circumstances with only the other devices within the first wireless mesh network. The devices within the second wireless mesh network communicate in normal circumstances with only the other devices within the second wireless mesh network.

Figure 2:
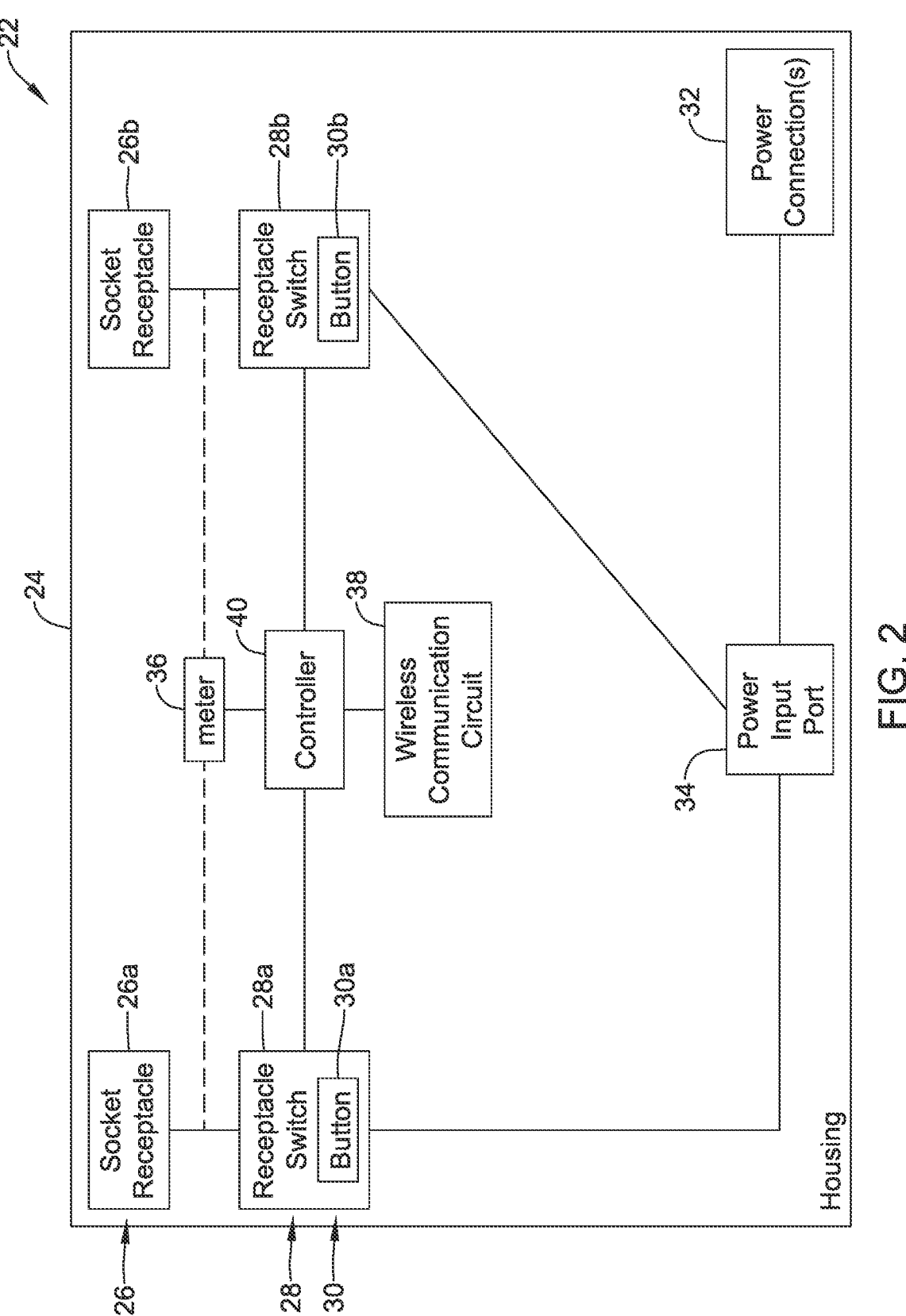
FIG. 2 is a schematic block diagram showing an illustrative smart socket usable in the illustrative system of FIG. 1.
Figure 3A:
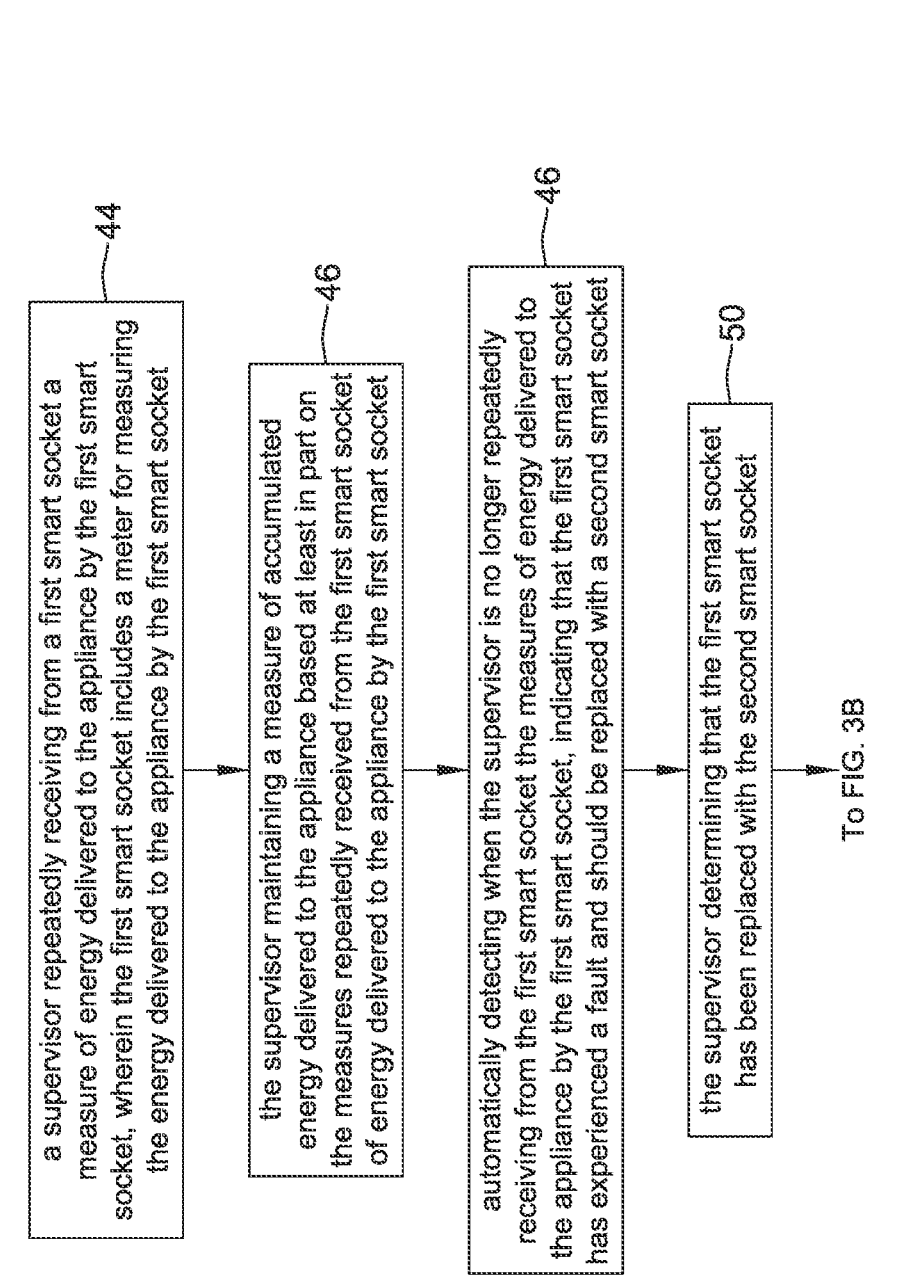

FIG. 2 is a schematic block diagram of an illustrative smart socket 22. The smart socket 22 may be considered as being an example of the smart sockets 18 and/or the smart sockets 20. The illustrative smart socket 22 includes a housing 24. As shown, the housing 24 houses a number of components of the smart socket 22, although some components of the smart socket 22 may be considered as being accessible from a position exterior to the housing 24. The smart socket 22 includes socket receptacles 26, individually labeled as 26a and 26b. The socket receptacles 26 are each configured to receive an electrical plug. While a pair of socket receptacles 26 are shown, in some cases the smart socket 22 may include only one socket receptacle 26. In some cases, the smart socket 22 may include three or more socket receptacles 26.

The smart socket 22 includes several receptacle switches 28, individually labeled as 28a and 28b. While two receptacle switches 28 are shown, in some cases, there may be only one receptacle switch 28 or three or more receptacle switches 28. In some cases, there will be one receptacle switch 28 for each receptacle socket 26. In some cases, each of the receptacle switches 28 may include a button 30, individually labeled as 30a and 30b. The buttons 30 may be used in actuating the receptacle switches 28, such as turning one of the receptacle switches 28 from on to off, or from off to on, for example.

The smart socket 22 includes one or more power connection(s) 32 for connecting to a power source (not shown). In some cases, the power connection(s) 32 may include a live connection, a neutral connection and a ground connection. The power connection(s) 32 may include one or more wiring terminals. The power connection(s) 32 may additionally or alternatively include one or more wires. A power input port 34 is configured to receive input power from the power connection(s) 32. Each of the receptacle switches 28 are operatively coupled between the power input port 34 and the corresponding socket receptacle 26. When in a closed position, the receptacle switch 28 allows power to pass from the power input port 34 to the corresponding socket receptacle 26. When in an open position, the receptacle switch 28 does not allow power to pass from the power input port 34 to the corresponding socket receptacle 26.

The illustrative smart socket 22 includes a meter 36 that is configured to capture one or more electrical characteristics of power that is delivered to each socket receptacle 26. The meter 36 may represent hardware that is configured to provide a measure of something being provided, such as electrical power. The meter 36 may represent software that is configured to provide a measure of something being provided, such as electrical power. The meter 36 may represent a combination of hardware and software. The meter 36 may be configured to provide an accurate method for recording energy usage and power consumption. A wireless communication circuit 38 is configured for wireless communicating with a remote device such as a mesh network, a gateway hub, a mobile device and/or another smart socket, for example. A controller 40 is operatively coupled with each receptacle switch 28, the meter 36 and the wireless communication circuit 38. The controller 40 is configured to receive from the meter 36 one or more of the captured electrical characteristics of the power that is delivered to the corresponding socket receptacle 26 and to transmit via the wireless communication circuit 38 one or more power parameters that are based at least in part on one or more of the received electrical characteristics of the power that is delivered to the socket receptacle 26. The controller 40 is configured to receive one or more commands via the wireless communication circuit 38, including a command that causes the controller 40 to switch the appropriate receptacle switch 28 between the closed position and the open position. In some cases, at least some of the receptacle switches 28 include a relay, and the controller 40 may be configured to switch the receptacle switch 28 by controlling the relay. In some cases, the controller 40 may override the buttons 30.

In some cases, there may be appliances that cannot be safely shut off. There may be appliances that are not safely turned on unless properly supervised. In some cases, a smart socket such as the smart socket 22 may be configured to have a Locked-On feature or a Locked-Off feature. The Locked-On feature and the Locked-Off feature may be implemented by the supervisor, for example. The Locked-On feature corresponds to having at least one socket receptacle of the smart socket always powered on, with the corresponding receptacle button 30 having no effect, although an indicator light on the receptacle switch may blink red, then revert to solid red to indicate that the power remains on. The Locked-Off feature corresponds to having at least one socket receptacle of the smart socket always powered off, with the corresponding receptacle button having no effect, although an indicator light may blink red, then revert to off to indicate that the power remains off.

FIGS. 3A, 3B, 3C and 3D are flow diagrams that together show an illustrative method 42 for maintaining a measure of accumulated energy delivered to an appliance. The method 42 includes a supervisor repeatedly receiving from a first smart socket a measure of energy delivered to the appliance by the first smart socket, wherein the first smart socket includes a meter for measuring the energy delivered to the appliance by the first smart socket, as indicated at block 44. In some cases, the supervisor repeatedly receives from the first smart socket a measure of accumulated energy delivered to the appliance by the first smart socket accumulated over a period of time. In some cases, the supervisor repeatedly receives from the first smart socket a measure of instantaneous energy delivered to the appliance by the first smart socket, wherein the measure of accumulated energy that is delivered to the appliance by the first smart socket is estimated based at least in part on the repeated measures of instantaneous energy delivered to the appliance by the first smart socket. In any event, the supervisor maintains a measure of accumulated energy delivered to the appliance based at least in part on the measures repeatedly received from the first smart socket of energy delivered to the appliance by the first smart socket, as indicated at block 46. The method 42 includes automatically detecting when the supervisor is no longer repeatedly receiving from the first smart socket the measures of energy delivered to the appliance by the first smart socket, indicating that the first smart socket has experienced a fault and should be replaced with a second smart socket, as indicated at block 48. The supervisor determines that the first smart socket has been replaced with the second smart socket, as indicated at block 50. In some cases, automatically detecting that the supervisor is no longer repeatedly receiving from the first smart socket the measures of energy delivered to the appliance by the first smart socket may include one or more of the supervisor detecting that the measures of energy repeatedly received from the first smart socket are not increasing when they are expected to be increasing, and/or the supervisor detecting that the first smart socket has gone offline (e.g. no heartbeat signal is being received from the first smart socket).

The method 42 continues on FIG. 3B, where once the supervisor determines that the first smart socket has been replaced with the second smart socket, the supervisor carries out several steps, as indicated at block 52. The steps include repeatedly receiving from the second smart socket a measure of energy delivered to the appliance by the second smart socket, wherein the second smart socket includes a meter for measuring the energy delivered to the appliance by the second smart socket, as indicated at block 52a. The steps include continue maintaining the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket, as indicated at block 52b. The steps include displaying the measure of accumulated energy delivered to the appliance on a dashboard, as indicated at block 52c.

In some cases, the method 42 continues on FIG. 3C, where the supervisor controls an operation of the appliance based at least in part on the measure of accumulated energy delivered to the appliance, as indicated at block 54. In some cases, the method 42 may additionally or alternatively include the supervisor using artificial intelligence (AI) to determine a projected time of failure of the appliance and/or a projected time of failure of the first smart socket based at least in part on the measures repeatedly received from the first smart socket of energy delivered to the appliance by the first smart socket, and providing a notification of the projected time of failure, as indicated at block 56. In some cases, the method 42 may additionally or alternatively include the supervisor identifying the second smart socket as a replacement for the first smart socket in a database, and associating the appliance with the measures previously received from the first smart socket of energy delivered to the appliance by the first smart socket with the measures repeatedly received from the second smart socket of energy delivered to the appliance by the second smart socket, as indicated at block 58. As an example, this may be determined by the supervisor using artificial intelligence (AI) to determine if the captured electrical characteristics of the power that is delivered to the corresponding socket receptacle 26 of the second smart socket matches that from the first socket and upon making a determination of matching the supervisor automatically associate the second socket with the first socket, such as for use in further matching. As another example, before replacement the failed smart socket may have stopped reporting any captured electrical characteristics back to the supervisor. When the replacement smart socket has been installed in place of the failed smart socket and the replacement smart socket starts reporting captured electrical characteristics, the supervisor may recognize that this means that the failed smart socket has been replaced. In some cases, the method 42 may additionally or alternatively include in response to automatically detecting that the supervisor is no longer repeatedly receiving from the first smart socket the measures of energy delivered to the appliance by the first smart socket, the supervisor providing a notification to replace the first smart socket with the second smart socket, as indicated at block 60.

In some cases, the method 42 may continue on FIG. 3D, with the supervisor controlling the second smart socket based at least in part on the measure of accumulated energy delivered to the appliance, as indicated at block 62. In some cases, the method 42 may additionally or alternatively include the supervisor controlling the second smart socket based at least in part on a rate of change of the measure of accumulated energy delivered to the appliance, as evidenced by block 64. In some cases, the method 42 may additionally or alternatively include the supervisor sending one or more commands to the second smart socket to turn off power to the appliance when the rate of change of the measure of accumulated (and/or instantaneous) energy delivered to the appliance crosses a threshold, as indicated at block 66.

Figure 4:
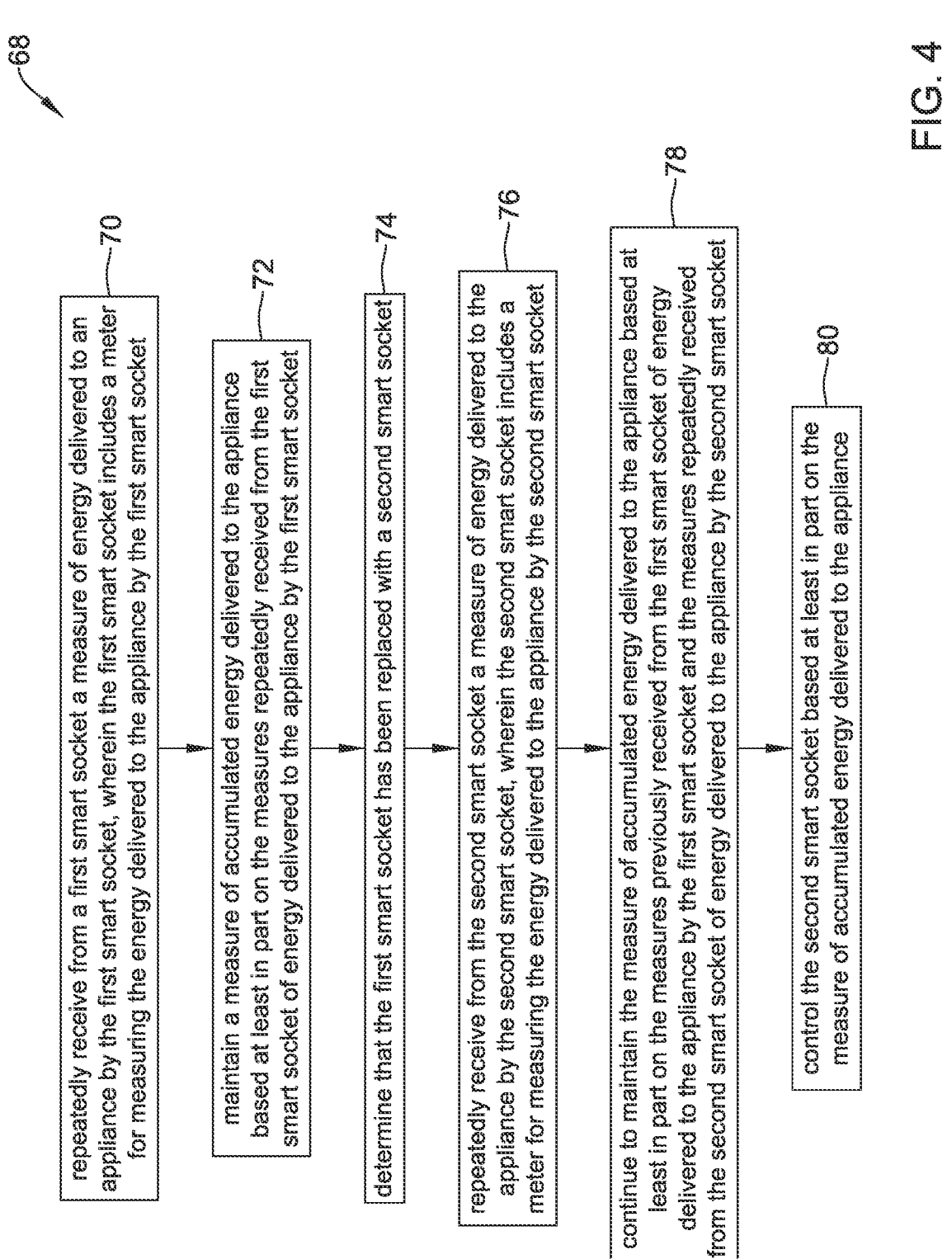
FIG. 4 is a flow diagram showing an illustrative series of steps that may be carried out by one or more processors when the one or more processors execute executable instructions stored on a non-transitory, computer-readable storage medium.

FIG. 4 is a flow diagram showing an illustrative series 68 of steps that may be carried out by one or more processors when the one or more processors execute executable instructions stored on a non-transitory, computer-readable storage medium. The one or more processors are caused to repeatedly receive from a first smart socket a measure of energy delivered to an appliance by the first smart socket, wherein the first smart socket includes a meter for measuring the energy delivered to the appliance by the first smart socket, as indicated at block 70. The one or more processors are caused to maintain a measure of accumulated energy delivered to the appliance based at least in part on the measures repeatedly received from the first smart socket of energy delivered to the appliance by the first smart socket, as indicated at block 72.

The one or more processors are caused to determine that the first smart socket has been replaced with a second smart socket, as indicated at block 74. The one or more processors are caused to repeatedly receive from the second smart socket a measure of energy delivered to the appliance by the second smart socket, wherein the second smart socket includes a meter for measuring the energy delivered to the appliance by the second smart socket, as indicate at block 76. The one or more processors are caused to continue to maintain the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket, as indicated at block 78. In some cases, the one or more processors may be caused to control the second smart socket based at least in part on the measure of accumulated energy delivered to the appliance, as indicated at block 80.

Figure 5A:
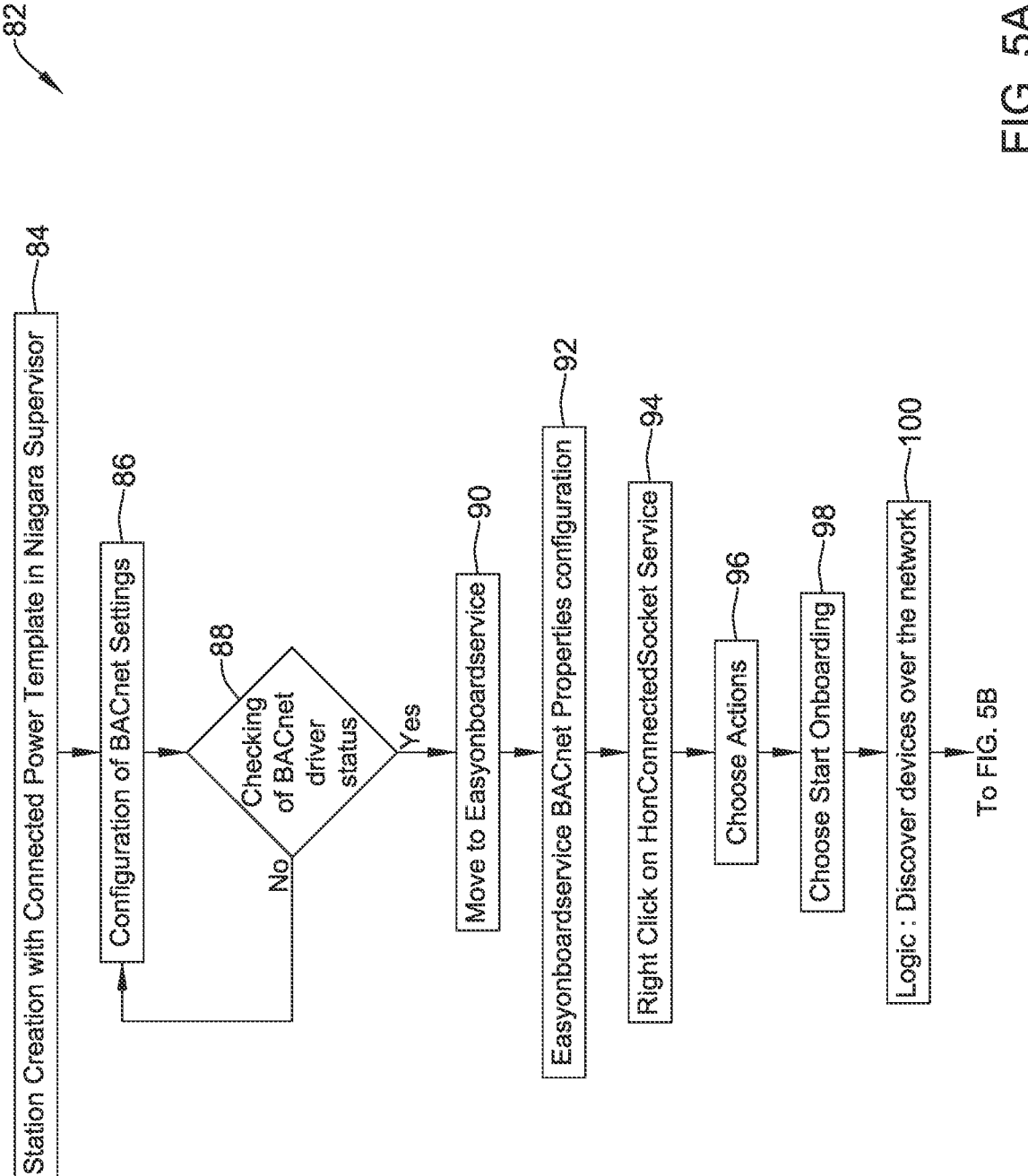

FIGS. 5A and 5B are flow diagrams that together show an illustrative method 82 of on-boarding a number of smart sockets. The method 82 includes station creation, as indicated at block 84. BACnet settings are configured, as indicated at block 86. The BACnet driver status is checked at a decision block 88. If not appropriate, control reverts to block 86. If appropriate, control passes to block 90 and the on-boarding process can begin. BACnet properties are configured, as indicated at block 92. A user can select the socket service, as indicated at block 94. The user can choose Actions, as indicated at block 96. The user can choose Start Onboarding, as indicated at block 98. Logic is used to discover devices over the network, as indicated at block 100.

The method 82 continues on FIG. 5B with a decision block 102 that determines whether a particular device type (e.g. smart socket and/or hub) is in the system. If not, control passes to block 104, indicating that onboarding failed. However, if yes, then control passes to block 106 and the device of the particular device type (e.g. smart socket and/or hub) is added to the supervisor database. The device is then automatically initialized, as indicated at block 108. This includes, for each of the devices of the particular device type, automatically adding predetermined objects, predetermined alarm extensions and/or predetermined history extensions to the supervisor database for each of the devices. Tagging is then applied, as indicated at block 110. A list of tagged objects may be reviewed, as indicated at block 112. Queries may be submitted, as indicated at block 114. The method 82 terminates at a Done block 116.

Figure 6A:
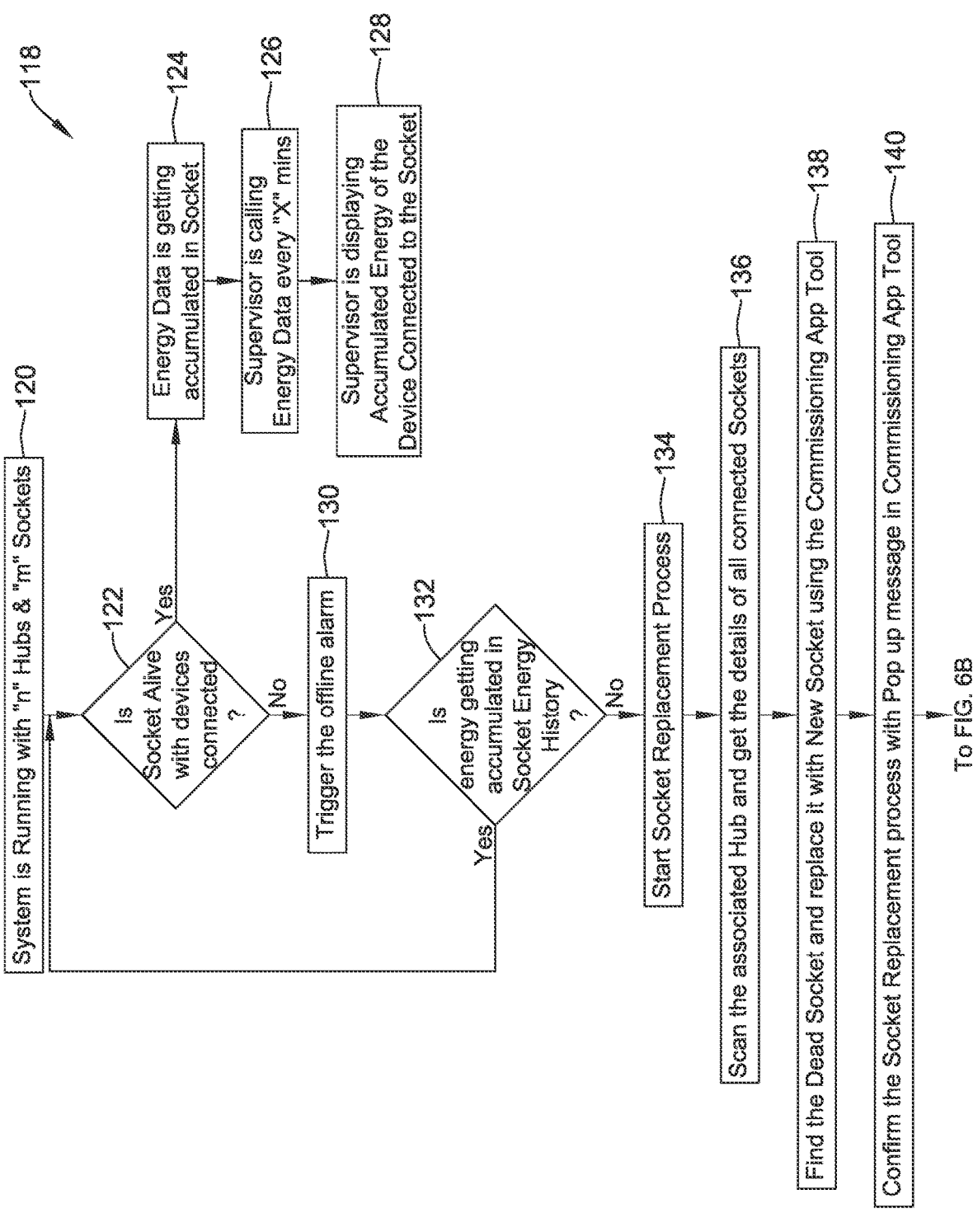

FIGS. 6A and 6B are flow diagrams that together show an illustrative method 118. The method 118 begins with the system running, with a number of hubs and a number of smart sockets, as indicated at block 120. At a decision block 122, a determination is made as to whether a particular smart socket is operating correctly. If yes, control passes to block 124, where energy consumption data is accumulated. The supervisor periodically requests energy consumption data, as indicated at block 126. The supervisor displays the accumulated energy consumption, as indicated at block 128.

If at the decision block 122 the answer is no, control passes to block 130, where an offline alarm is triggered. At a decision block 132, a determination is made as to whether the socket energy history is accumulating energy consumption. If so, control reverts to decision block 122. If not, control passes to block 134 where the smart socket replacement process begins. The associated hub is scanned to obtain details regarding the smart socket in question, as indicated at block 136. The faulty smart socket is found and replaced, as indicated at block 138. The smart socket replacement is confirmed, as indicated at block 140.

The method 118 continues on FIG. 6B, where the new smart socket starts reporting energy consumption, as indicated at block 142. The supervisor periodically requests energy consumption data, as indicated at block 144. The new consumption data is compared with the previous consumption data, as indicated at block 146. The accumulated energy consumption from the old smart socket is added to that of the new smart socket, as indicated at block 148. The supervisor displays the resulting accumulated energy consumption, as indicated at block 150.

Figure 7:
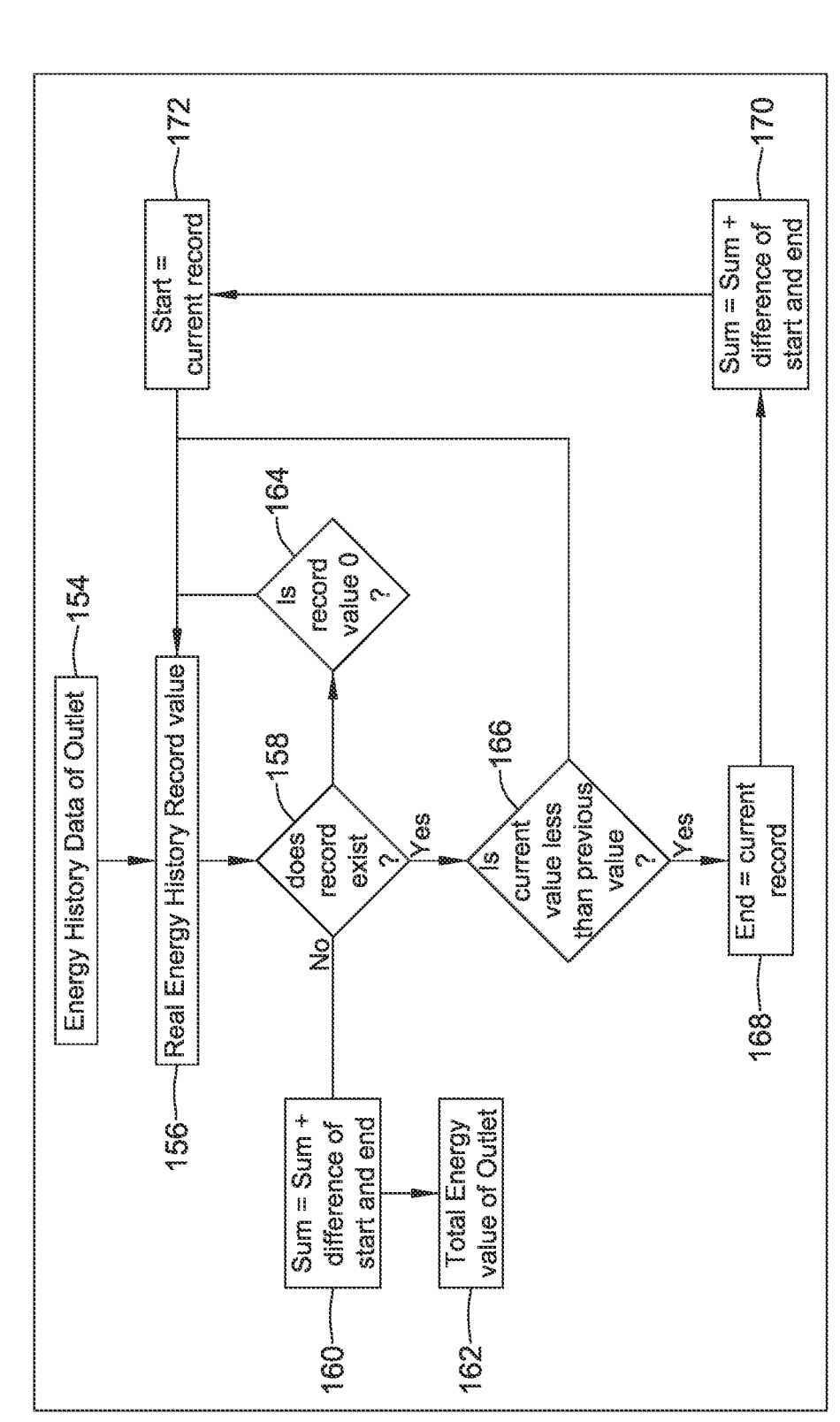
FIG. 7 is a flow diagram showing an illustrative method.

FIG. 7 is a flow diagram showing an illustrative method 152. The method 152 begins with the energy history data of an outlet, as indicated at block 154. The energy history value is read, as indicated at block 156. At a decision block 158, a determination is made as to whether a record exists for that outlet. If not, control passes to block 160, and a summation is made. Control also passes to a decision block 164, where a determination is made as to whether the record value is zero. The summation is the total energy value for the outlet, as indicated at block 162. However, if there is a record for that outlet, control passes to a decision block 166, where a determination is made as to whether the current value is less than a previous value. If not, control reverts to block 156. If so, control passes to block 168 where the end equals the current record. Control passes to block 170 where a summation is made. At block 172, the start is set equal to the current record. Control then reverts to block 156.

FIGS. 8A, 8B and 8C are flow diagrams that together show an illustrative method 174 for reducing energy consumption of one or more appliances, wherein each of the one or more appliances is plugged into a socket receptacle of one or more socket receptacles of a corresponding one of one or more smart sockets, and wherein each of the one or more smart sockets include a meter for measuring the energy delivered to each of the appliances of the one or more appliances that are plugged into the one or more socket receptacles of the corresponding smart socket. The method 174 includes, over a baseline time period, a supervisor repeatedly receiving from each of the one or more smart sockets a measure of baseline energy over time that is delivered to each of the appliances of the one or more appliances that are plugged into the one or more socket receptacles of the corresponding smart socket, as indicated at block 176. A determination is made as to which of the one or more appliances have a power on mode and a power standby mode based at least in part on the measure of baseline energy delivered to each of the appliances during the baseline time period, wherein the power standby mode consumes less power than the power on mode, as indicated at block 178. In some cases, the power consumed by an electrical device during a power standby mode may be less than 30 percent of the power consumed by the electrical device during a power on mode. The power consumed during a power standby mode by the electrical device may be less than 20 percent, less than 10 percent or less than 5 percent of the power consumed by the electrical device during a power on mode, for example. During subsequent operation, the supervisor identifies when each of the one or more appliances that are identified as having a power standby mode is in its power standby mode, and in response, turning off the socket receptacles of the smart sockets that corresponds to the one or more appliances identified as being in their power standby mode a predetermined time after the corresponding appliance was identified by the supervisor as being in its power standby mode, as indicated at block 180. The predetermined time may be programmable.

In some cases, each of the one or more smart sockets includes one or more receptacle switches, where each receptacle switch, when in a closed position, allows power to be delivered to the corresponding socket receptacle, and when in an open position, does not allow power to be delivered to the corresponding socket receptacle, and one or more receptacle switch buttons, wherein each of the one or more receptacle switch buttons, when manually pressed by a user causes the corresponding receptible switch to alternately switch between the open position and the closed position (sometimes subject to an override by a supervisor). The method 174 may additionally or alternatively allow a user to manually turn on the socket receptacle of the smart socket that corresponds to an appliance that was turned off by the supervisor by manually pressing the corresponding receptacle switch button, as indicated at block 182.

The method 174 continues on FIG. 8B, where the supervisor identifies when one or more of the appliances that are plugged into a socket receptacle of one or more socket receptacles is currently consuming energy that is above a threshold energy level, as indicated at block 184. The supervisor may automatically turn off the socket receptacles of the one or more smart sockets that correspond to the one or more appliances that are identified as currently consuming energy that is above the threshold energy level, as indicated at block 186.

In some cases, each of the one or more smart sockets includes one or more receptacle switches, where each receptacle switch, when in a closed position, allows power to be delivered to the corresponding socket receptacle, and when in an open position, does not allow power to be delivered to the corresponding socket receptacle, and one or more receptacle switch buttons, wherein each of the one or more receptacle switch buttons, when manually pressed by a user causes the corresponding receptible switch to alternately switch between the open position and the closed position. The method 174 may additionally or alternatively include preventing a user from manually turn on the socket receptacles of the one or more smart sockets that correspond to the one or more appliances that are identified as currently consuming energy that is above the threshold energy level and turned off by the supervisor by manually pressing the corresponding receptacle switch button, as indicated at block 188.

In some cases, the method 174 may further include setting a schedule for each of one or more of the appliances, as indicated at block 190. The supervisor may turn the socket receptacles of the smart sockets that correspond to the one or more appliance with a set schedule on and off according to the set schedule, as indicated at block 192.

The method 174 continues on FIG. 8C, where each of the one or more smart sockets includes one or more receptacle switches, where each receptacle switch, when in a closed position, allows power to be delivered to the corresponding socket receptacle, and when in an open position, does not allow power to be delivered to the corresponding socket receptacle, and one or more receptacle switch buttons, wherein each of the one or more receptacle switch buttons, when manually pressed by a user causes the corresponding receptible switch to alternately switch between the open position and the closed position (sometimes subject to an override by a supervisor). The method 174 may include allowing a user to manually turn on the socket receptacle of the smart socket that corresponds to a first appliance that was turned off by the supervisor in accordance with the set schedule by manually pressing the corresponding receptacle switch button, as indicated at block 194. The method 174 may alternatively or additionally include preventing the user from manually turn on the socket receptacle of the smart socket that corresponds to a second appliance that was turned off by the supervisor in accordance with the set schedule by manually pressing the corresponding receptacle switch button, as indicated at block 196.

The method 174 may alternatively or additionally include establishing a standby energy threshold for each of the one or more appliances that are identified as having a power standby mode based at least in part on the measure of baseline energy delivered to each of the appliances during the baseline time period, as indicated at block 198. In some cases, the supervisor may identify when each of the one or more appliances identified as having a power standby mode is in its power standby mode by comparing a measure of energy currently delivered to the appliance with the corresponding standby energy threshold established for the appliance, as indicated at block 200.

FIGS. 9A and 9B are flow diagrams that together show an illustrative method 202 for reducing energy consumption of one or more appliances, wherein each of the one or more appliances is plugged into a socket receptacle of one or more socket receptacles of a corresponding one of one or more smart sockets, and wherein each of the one or more smart sockets include a meter for measuring the energy delivered to each of the appliances of the one or more appliances that are plugged into the one or more socket receptacles of the corresponding smart socket. The method 202 includes over a baseline time period, a supervisor repeatedly receiving from each of the one or more smart sockets a measure of baseline energy over time that is delivered to each of the appliances of the one or more appliances that are plugged into the one or more socket receptacles of the corresponding smart socket, as indicated at block 204. A determination is made as to which of the one or more appliances have a power on mode and a power standby mode based at least in part on the measure of baseline energy delivered to each of the appliances during the baseline time period, wherein the power standby mode consumes less power than the power on mode, as indicated at block 206.

A standby energy threshold is established for each of the one or more appliances that are identified as having a power standby mode based at least in part on the measure of baseline energy delivered to each of the appliances during the baseline time period, as indicated at block 208. The supervisor identifies when each of the one or more appliances identified as having a power standby mode is in its power standby mode by comparing a measure of energy currently delivered to the appliance with the corresponding standby energy threshold established for the appliance, and in response, turning off the socket receptacles of the smart sockets that corresponds to the one or more appliances identified as being in their power standby mode after the corresponding appliance was identified by the supervisor as being in its power standby mode, as indicated at block 210. The method 202 may alternatively or additionally include the supervisor identifying when one or more of the appliances that are plugged into a socket receptacle of one or more socket receptacles are currently consuming energy that is above a threshold energy level, as indicated at block 212.

The method 202 may continue with FIG. 9B, where the supervisor automatically turns off the socket receptacles of the one or more smart sockets that correspond to the one or more appliances that are identified as currently consuming energy that is above the threshold energy level, as indicated at block 214. In some cases, the supervisor turns off the socket receptacles of the smart sockets that corresponds to the one or more appliances identified as being in their power standby mode following a programmable period of time after the corresponding appliance was identified by the supervisor as being in its power standby mode.

In some cases, each of the one or more appliances includes a corresponding programmable time period. The method 202 may alternatively or additionally include setting a schedule for each of one or more of the appliances, as indicated at block 216. The supervisor may turn the socket receptacles of the smart sockets that correspond to the one or more appliance with a set schedule on and off according to the set schedule, as indicated at block 218.

In some cases, each of the one or more smart sockets includes one or more receptacle switches, where each receptacle switch, when in a closed position, allows power to be delivered to the corresponding socket receptacle, and when in an open position, does not allow power to be delivered to the corresponding socket receptacle, and one or more receptacle switch buttons, wherein each of the one or more receptacle switch buttons, when manually pressed by a user causes the corresponding receptible switch to alternately switch between the open position and the closed position. The method 202 may further include allowing a user to manually turn on the socket receptacle of the smart socket that corresponds to an appliance that was turned off by the supervisor in accordance with the set schedule by manually pressing the corresponding receptacle switch button, as indicated at block 220. In some cases, the method 202 may alternatively or additionally include preventing a user from manually turn on the socket receptacle of the smart socket that corresponds to an appliance that was turned off by the supervisor in accordance with the set schedule by manually pressing the corresponding receptacle switch button, as indicated at block 222.

Figure 10:
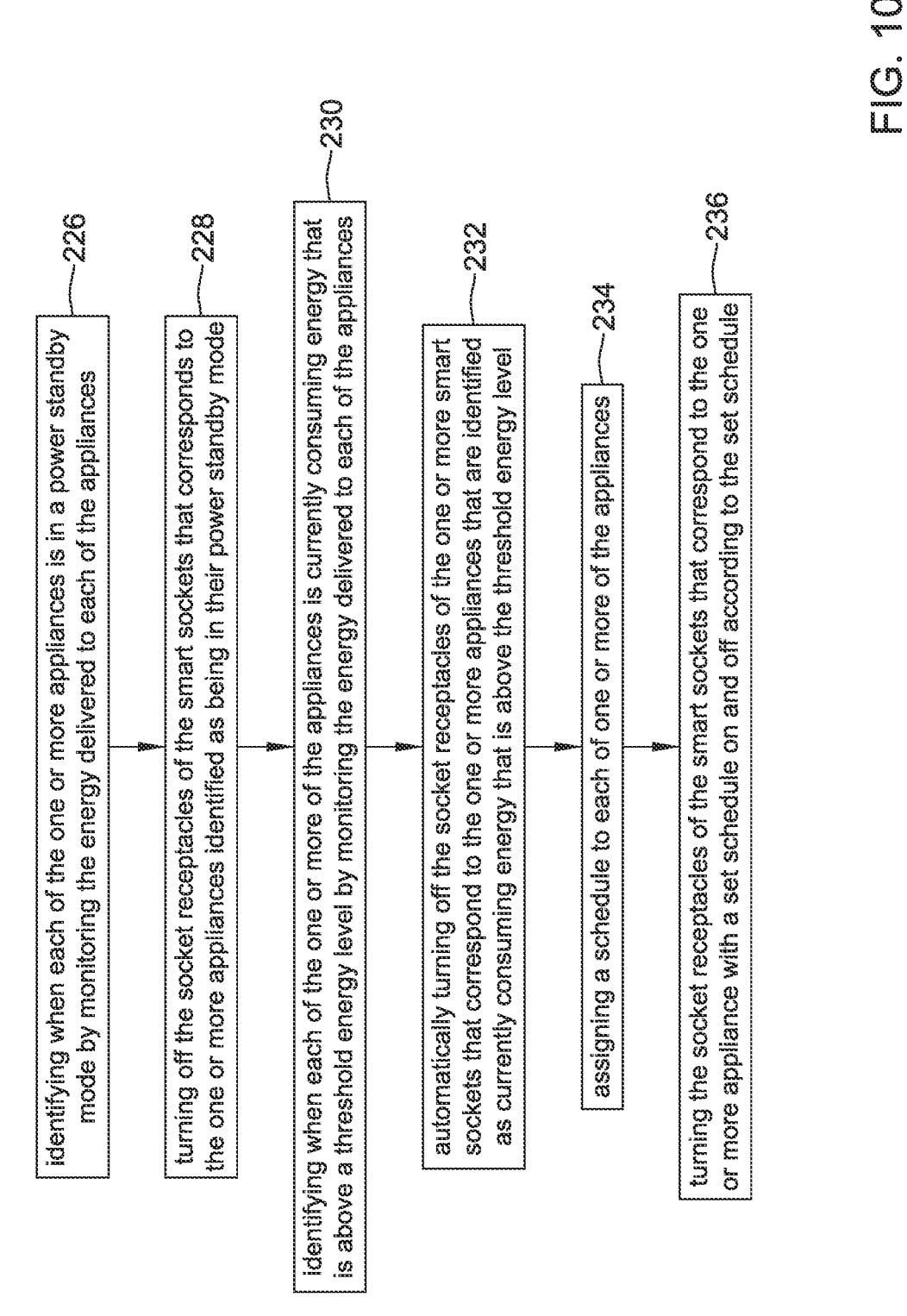
FIG. 10 is a flow diagram showing an illustrative method for reducing energy consumption of one or more appliances.

FIG. 10 is a flow diagram showing an illustrative method 224 for reducing energy consumption of one or more appliances, wherein each of the one or more appliances is plugged into a socket receptacle of one or more socket receptacles of a corresponding one of one or more smart sockets, and wherein each of the one or more smart sockets include a meter for measuring the energy delivered to each of the appliances of the one or more appliances that are plugged into the one or more socket receptacles of the corresponding smart socket. The method 224 includes identifying when each of the one or more appliances is in a power standby mode by monitoring the energy delivered to each of the appliances, as indicated at block 226. The method 224 includes turning off the socket receptacles of the smart sockets that corresponds to the one or more appliances identified as being in their power standby mode, as indicated at block 228.

In some cases, the method 224 may further include identifying when each of the one or more of the appliances is currently consuming energy that is above a threshold energy level by monitoring the energy delivered to each of the appliances, as indicated at block 230. The method 224 may include automatically turning off the socket receptacles of the one or more smart sockets that correspond to the one or more appliances that are identified as currently consuming energy that is above the threshold energy level, as indicated at block 232. In some cases, the method 224 may alternatively or additionally include assigning a schedule to each of one or more of the appliances, as indicated at block 234. The method 224 may include turning the socket receptacles of the smart sockets that correspond to the one or more appliance with a set schedule on and off according to the set schedule, as indicated at block 236.

FIGS. 11A and 11B are flow diagrams that together show an illustrative method 238 for on-boarding a plurality of smart sockets with a supervisor, wherein the plurality of smart sockets are operatively discoverable by the supervisor via a network. The method 238 includes discovering the plurality of smart sockets on the network, as indicated at block 240. In some cases, discovering the plurality of smart sockets on the network may include discovering all devices on the network (e.g. Bacnet network), and then filtering the discovered devices to include only the plurality of smart sockets on the network and/or any intermediate devices (e.g. hubs) on the network that are logically between the supervisor and the plurality of smart sockets. The intermediate devices may include a smart socket hub that is connected directly to the network, forms a mesh network with one or more of the plurality of smart sockets, and/or makes the one or more of the plurality of smart sockets addressable on the network.

A number of steps are carried out for each discovered smart socket, as indicated at block 242. The number of steps include automatically adding the smart socket to a supervisor database, as indicated at block 242*a*. The number of steps include automatically adding a predetermined set of two or more objects for the smart socket in the supervisor database, wherein the same predetermined set of two or more objects are added to the supervisor database for each discovered smart socket, as indicated at block 242*b*. The number of steps include automatically adding one or more predetermined alarm extensions to predetermined ones of the two or more objects of the smart socket in the supervisor database, wherein the same predetermined alarm extensions are added to the same predetermined ones of the two or more objects in the supervisor database for each discovered smart socket, as indicated at block 242*c*. The number of steps include automatically adding one or more predetermined history extensions to predetermined ones of the two or more objects of the smart socket in the supervisor database, wherein the same predetermined history extensions are added to the same predetermined ones of the two or more objects in the supervisor database for each discovered smart socket, as indicated at block 242*d*. In some cases, at least one of these steps may be initiated by a user. In some cases, the automatically adding steps are automatically initiated by the system. In some cases, at least some of the automatically adding steps are facilitated by an auto-discovery functionality that is built into the relevant communications protocol. For example, BACnet includes an auto-discovery function. Mesh networks can include an auto-discovery function that in some cases may be always running.

The method 238 continues on FIG. 11B, where predetermined ones of the two or more objects and/or extensions of each of the discovered smart sockets are automatically mapped to a predetermined dashboard, as indicated at block 244. In some cases, the method 238 may alternatively or additionally include, for each discovered smart socket, automatically changing an object type of predetermined ones of the two or more objects of the smart socket in the supervisor database, as indicated at block 246.

The method 238 may alternatively or additionally include receiving user input before automatically adding one or more predetermined alarm extensions to predetermined ones of the two or more objects of the smart socket in the supervisor database and/or before automatically adding one or more predetermined history extensions to predetermined ones of the two or more objects of the smart socket in the supervisor database, as indicated at block 248. The user input may at least partially define a predetermined alarm extension for one or more of the objects, as indicated at block 248*a*. The user input may at least partially define a predetermined history extension for one or more of the objects, as indicated at block 248*b*. The user input may at least partially define an object type of one or more of the objects, as indicated at block 248*c*.

In some cases, the supervisor references the supervisor database to access data from each of the plurality of discovered smart sockets. In some cases, the supervisor references the supervisor database, and based at least in part on the supervisor database, the supervisor sending control commands to control one or more of the plurality of discovered smart sockets.

In some cases, the predetermined set of two or more objects may include two or more of a temperature object corresponding to an internal temperature of the corresponding smart socket, an instantaneous current object corresponding to an instantaneous current delivered by a receptacle of the corresponding smart socket, an instantaneous power object corresponding to an instantaneous power delivered by the receptacle of the corresponding smart socket, an accumulated energy object corresponding to an accumulated energy delivered by the receptacle of the corresponding smart socket, a power high limit object corresponding to a high power limit threshold for the receptacle of the corresponding smart socket, a temperature high limit object corresponding to a high temperature limit threshold for the receptacle of the corresponding smart socket, a power high limit alarm delay object corresponding to a high power limit alarm delay for the receptacle of the corresponding smart socket, and a power low limit alarm delay object corresponding to a low power limit alarm delay for the receptacle of the corresponding smart socket.

In some cases, each of the one or more predetermined alarm extensions may define one or more alarm conditions for the corresponding objects in which the predetermined alarm extensions have been added. In some cases, each of the one or more predetermined alarm extensions may define one or more predetermined alarm limits. In some cases, each of the one or more predetermined history extensions may define a data retention policy for the corresponding objects in which the predetermined history extensions have been added. For example, one object (e.g. instantaneous power) may have a predetermined history extension of 1 year making data associated with that object available for display and/or analysis for one year, while another object (e.g. internal temperature) may have a predetermined history extension of 6 months.

Figure 12:
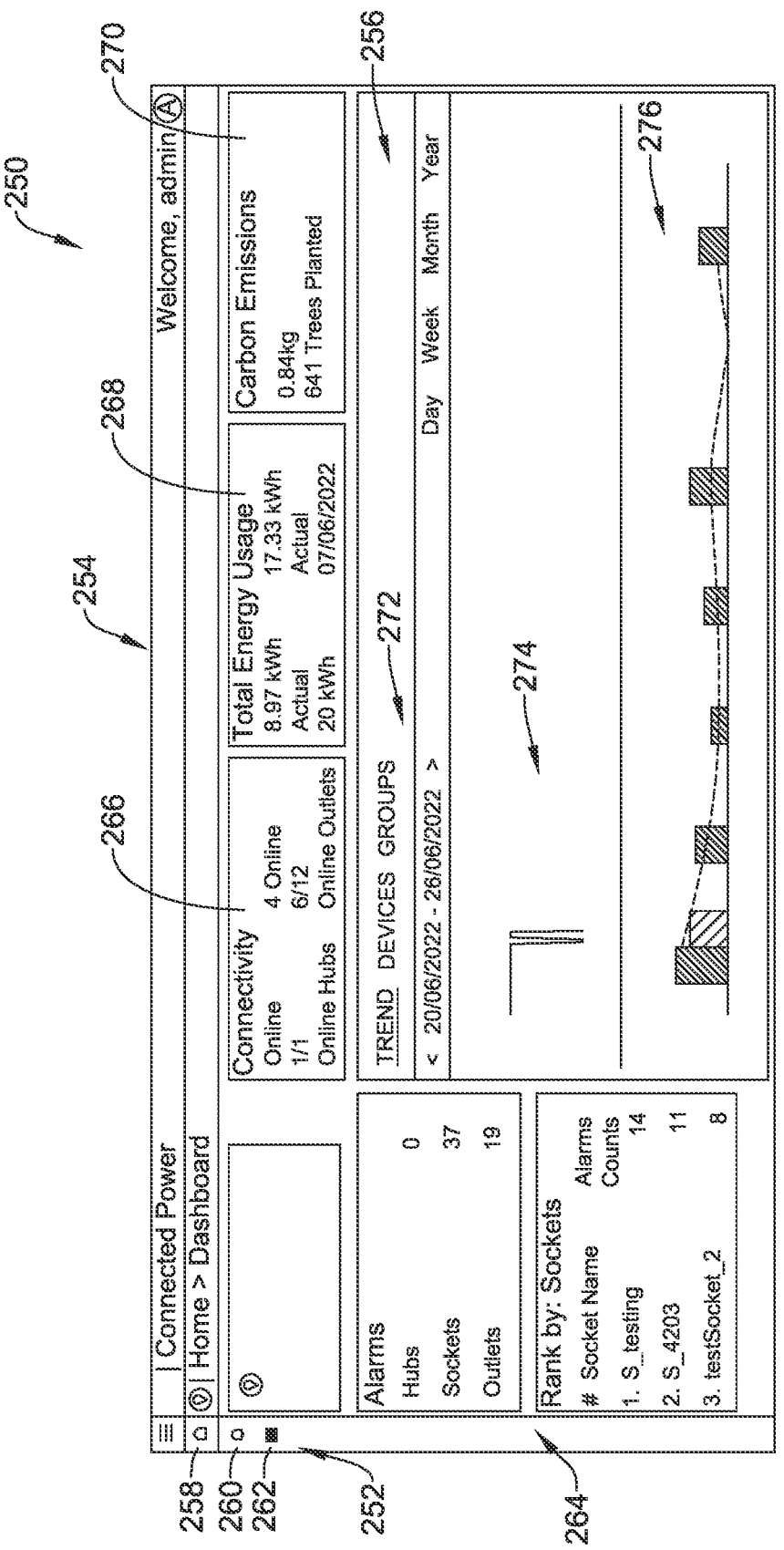
FIG. 12 is a screen shot showing an illustrative dashboard.

FIG. 12 is a screen shot showing an illustrative dashboard 250 that may be displayed. The dashboard 250 provides a summary of information derived from the plurality of smart sockets. The smart sockets may capture information related to the smart sockets, such as power consumption, connectivity and various alarms. This information may be displayed on a dashboard such as the dashboard 250. The dashboard 250 may display information for an entire building, a portion of a building, or even a summary of multiple buildings. As shown, the dashboard 250 may be considered as being divided into several area. The dashboard 250 includes a navigation pane 252, a title bar 254 and an information pane 256. The navigation pane 252 includes a HOME icon 258, an ALARM icon 260 and a SCHEDULE icon 262. These icons may be used to navigate between a HOME screen (as shown), an ALARM screen or a SCHEDULE screen. The title bar 254 includes information such as a station name and a user type (Admin or Non-Admin).

The information pane 256 may be considered as being divided into a number of sections. Along the left side of the information pane 256 is an alarm widget 264 indicating how many hubs, sockets and outlets are currently in alarm. The alarm widget 264 may include a ranked listing of which sockets have the greatest number of alarms. Across the top of the information pane 256 is a connectivity widget 266 showing a number of online devices and a number of offline devices. An energy usage widget 268 provides details on current and historical energy consumption. A carbon emissions section 270 provides information detailing how the reduced carbon emissions result from reduced energy consumption.

The information pane 256 includes a tool bar 272 that allows a user to select between TREND (as shown), DEVICES and GROUPS. Depending on the selection made via the tool bar 272, the information pane 256 includes a first graph 274 showing system power usage and a second graph 276 showing an energy comparison. Other graphs may also be displayed in this section.

Having thus described several illustrative embodiments of the present disclosure, those of skill in the art will readily appreciate that yet other embodiments may be made and used within the scope of the claims hereto attached. It will be understood, however, that this disclosure is, in many respects, only illustrative. Changes may be made in details, particularly in matters of shape, size, arrangement of parts, and exclusion and order of steps, without exceeding the scope of the disclosure. The disclosure's scope is, of course, defined in the language in which the appended claims are expressed.

What is claimed is:

1. A method for maintaining a measure of accumulated energy delivered to an appliance, the method comprising:

a supervisor repeatedly receiving from a first smart socket a measure of energy delivered to the appliance by the first smart socket, wherein the first smart socket includes a meter for measuring the energy delivered to the appliance by the first smart socket;

the supervisor maintaining the measure of accumulated energy delivered to the appliance based at least in part on the measures of energy repeatedly received from the first smart socket of energy delivered to the appliance by the first smart socket;

automatically detecting when the supervisor is no longer repeatedly receiving from the first smart socket the measures of energy delivered to the appliance by the first smart socket, indicating that the first smart socket has experienced a fault and should be replaced with a second smart socket;

the supervisor determining that the first smart socket has been replaced with the second smart socket;

once the supervisor determines that the first smart socket has been replaced with the second smart socket, the supervisor:

repeatedly receiving from the second smart socket a measure of energy delivered to the appliance by the second smart socket, wherein the second smart socket includes a meter for measuring the energy delivered to the appliance by the second smart socket;

continue maintaining the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket; and displaying the measure of accumulated energy delivered to the appliance on a dashboard, wherein the measure of accumulated energy delivered to the appliance is equal to a sum of the energy delivered to the appliance by the first smart socket and the energy delivered to the appliance by the second smart socket.

2. The method of claim 1, further comprising the supervisor controlling an operation of the appliance based at least in part on the measure of accumulated energy delivered to the appliance.

3. The method of claim 1, wherein the automatically detecting that the supervisor is no longer repeatedly receiving from the first smart socket the measures of energy delivered to the appliance by the first smart socket comprises the supervisor detecting that the first smart socket has gone offline.

4. The method of claim 1, further comprising:

the supervisor using artificial intelligence (AI) to determine a projected time of failure of the appliance and/or the first smart socket based at least in part on the measures repeatedly received from the first smart socket of energy delivered to the appliance by the first smart socket, and providing a notification of the projected time of failure.

5. The method of claim 1, further comprises:

the supervisor identifying the second smart socket as a replacement for the first smart socket in a database, and associating the appliance with the measures previously received from the first smart socket of energy delivered to the appliance by the first smart socket with the measures repeatedly received from the second smart socket of energy delivered to the appliance by the second smart socket.

6. The method of claim 1, further comprising:

in response to the automatically detecting that the supervisor is no longer repeatedly receiving from the first smart socket the measures of energy delivered to the appliance by the first smart socket, the supervisor providing a notification to replace the first smart socket with the second smart socket.

7. The method of claim 1, wherein the supervisor repeatedly receives from the first smart socket the measure of accumulated energy delivered to the appliance by the first smart socket accumulated over a period of time.

8. The method of claim 1, wherein the supervisor repeatedly receives from the first smart socket a measure of instantaneous energy delivered to the appliance by the first smart socket, wherein the measure of accumulated energy that is delivered to the appliance by the first smart socket is estimated based at least in part on the repeated measures of instantaneous energy delivered to the appliance by the first smart socket.

9. The method of claim 1, wherein each of the first smart socket and the second smart socket comprises:

a housing that houses:

one or more socket receptacles each for receiving an electrical plug of the appliance;

one or more power connections for connecting to a power source;

a power input port for receiving input power from the one or more power connections;

one or more receptacle switches each operatively coupled between the power input port and a corresponding socket receptacle, each receptacle switch, when in a closed position, allows power to pass from the power input port to the corresponding socket receptacle, and when in an open position, does not allow power to pass from the power input port to the corresponding socket receptacle;

one or more receptacle switch buttons accessible from outside of the housing, wherein each of the one or more receptacle switch buttons, when manually pressed by a user causes the corresponding receptible switch to alternately switch between the open position and the closed position;

the meter for capturing a measure of energy delivered to each of the one or more socket receptacles;

a wireless communication circuit for wirelessly communicating over a wireless mesh network;

a controller operatively coupled to the one or more receptacle switches, the meter and the wireless communication circuit, the controller configured to:

repeatedly receive from the meter the measure of energy delivered to each of the one or more socket receptacles;

repeatedly transmit via the wireless communication circuit the measure of energy delivered to each of the one or more socket receptacles; and receive one or more commands via the wireless communication circuit, including a command that causes the controller to switch one or more of the receptacle switches between the closed position and the open position.

10. The method of claim 1, further comprising the supervisor controlling the second smart socket based at least in part on the measure of accumulated energy delivered to the appliance.

11. The method of claim 1, further comprising the supervisor controlling the second smart socket based at least in part on a rate of change of the measure of accumulated energy delivered to the appliance.

12. The method of claim 11, further comprising the supervisor sending one or more commands to the second smart socket to turn off power to the appliance when the rate of change of the measure of accumulated energy delivered to the appliance crosses a threshold.

13. A system for maintaining a measure of accumulated energy delivered to an appliance, the system comprising:

a first smart socket that includes a meter for measuring the energy delivered to the appliance by the first smart socket a second smart socket that includes a meter for measuring the energy delivered to the appliance by the second smart socket, the second smart socket for replacing the first smart socket;

a supervisor configured to:

repeatedly receive from the first smart socket a measure of energy delivered to the appliance by the first smart socket;

maintain the measure of accumulated energy delivered to the appliance based at least in part on the measures of energy repeatedly received from the first smart socket of energy delivered to the appliance by the first smart socket;

automatically detect when the supervisor is no longer repeatedly receiving from the first smart socket measures of energy delivered to the appliance by the first smart socket, indicating that the first smart socket has experienced a fault and should be replaced with the second smart socket;

determine that the first smart socket has been replaced with the second smart socket;

repeatedly receive from the second smart socket a measure of energy delivered to the appliance by the second smart socket; and continue to maintain the measure of accumulated energy delivered to the appliance based at least in part on the measures previously received from the first smart socket of energy delivered to the appliance by the first smart socket and the measures repeatedly received from the second smart socket of energy delivered to the appliance by the second smart socket, wherein the measure of accumulated energy delivered to the appliance is equal to a sum of the energy delivered to the appliance by the first smart socket and the energy delivered to the appliance by the second smart socket.

14. The system of claim 13, further comprising:

in response to automatically detecting that the supervisor is no longer repeatedly receiving from the first smart socket the measures of energy delivered to the appliance by the first smart socket, the supervisor is configured to provide a notification to replace the first smart socket with the second smart socket.

15. The system of claim 13, where the supervisor is configured to display the measure of accumulated energy delivered to the appliance on a dashboard.

16. The system of claim 13, wherein the supervisor is configured to control the second smart socket based at least in part on the measure of accumulated energy delivered to the appliance.

17. The system of claim 13, wherein the supervisor is configured to control the second smart socket based at least in part on a rate of change of the measure of accumulated energy delivered to the appliance.

18. The system of claim 13, wherein each of the first smart socket and the second smart socket comprises:

a housing that houses:

one or more socket receptacles each for receiving an electrical plug of the appliance;

one or more power connections for connecting to a power source;

a power input port for receiving input power from the one or more power connections;

one or more receptacle switches each operatively coupled between the power input port and a corresponding socket receptacle, each receptacle switch, when in a closed position, allows power to pass from the power input port to the corresponding socket receptacle, and when in an open position, does not allow power to pass from the power input port to the corresponding socket receptacle;

one or more receptacle switch buttons accessible from outside of the housing, wherein each of the one or more receptacle switch buttons, when manually pressed by a user causes the corresponding receptible switch to alternately switch between the open position and the closed position;

the meter for capturing a measure of energy delivered to each of the one or more socket receptacles;

a wireless communication circuit for wirelessly communicating over a wireless mesh network;

a controller operatively coupled to the one or more receptacle switches, the meter and the wireless communication circuit, the controller configured to:

repeatedly receive from the meter the measure of energy delivered to each of the one or more socket receptacles;

repeatedly transmit via the wireless communication circuit the measure of energy delivered to each of the one or more socket receptacles; and receive one or more commands via the wireless communication circuit, including a command that causes the controller to switch one or more of the receptacle switches between the closed position and the open position.

* * * * *